(12) United States Patent
Colinge et al.

(10) Patent No.: US 10,157,928 B2
(45) Date of Patent: Dec. 18, 2018

(54) SEMICONDUCTOR DEVICES AND METHODS OF MANUFACTURE THEREOF

(71) Applicant: Taiwan Semiconductor Manufacturing Company, Ltd., Hsinchu (TW)

(72) Inventors: Jean-Pierre Colinge, Hsinchu (TW); Carlos H. Diaz, Hsinchu (TW); Ta-Pen Guo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/807,391

(22) Filed: Nov. 8, 2017

(65) Prior Publication Data
US 2018/0069011 A1 Mar. 8, 2018

Related U.S. Application Data

(60) Continuation of application No. 15/217,307, filed on Jul. 22, 2016, now Pat. No. 9,825,043, which is a
(Continued)

(51) Int. Cl.
H01L 21/02 (2006.01)
H01L 27/06 (2006.01)
(Continued)

(52) U.S. Cl.
CPC .... *H01L 27/1104* (2013.01); *H01L 21/02595* (2013.01); *H01L 21/26513* (2013.01);
(Continued)

(58) Field of Classification Search
None
See application file for complete search history.

(56) References Cited

U.S. PATENT DOCUMENTS

| 7,741,645 B2* | 6/2010 | Zhu | H01L 21/8221 257/67 |
| 2007/0181953 A1* | 8/2007 | Lyu | H01L 21/8221 257/382 |

(Continued)

FOREIGN PATENT DOCUMENTS

| KR | 20090120937 A | 11/2009 |
| KR | 20140086305 A | 7/2014 |

(Continued)

OTHER PUBLICATIONS

Chen, Hung-Bin et al., "Characteristics of Gate-All-Around Junctionless Poly-Si TFTs With an Ultrathin Channel," IEEE Electron Device Letters, vol. 34, No. 7, Jul. 2013.
(Continued)

*Primary Examiner* — Whitney Moore
(74) *Attorney, Agent, or Firm* — Slater Matsil, LLP

(57) ABSTRACT

A method of forming an SRAM cell includes forming a first vertical pull-down transistor, a second vertical pull-down transistor, a first vertical pass-gate transistor, and a second vertical pass-gate transistor over a semiconductor substrate. The method includes forming a first conductive trace over a top surface of the first vertical pull-down transistor and the first vertical pass-gate transistor, forming a second conductive trace over a top surface of the second vertical pull-down transistor and the second vertical pass-gate transistor, and forming a first vertical pull-up transistor over a first portion of the first conductive trace. The method also includes forming a second vertical pull-up transistor over a first portion of the second conductive trace. The method also includes forming a first via over the first conductive trace and forming a second via over the second conductive trace.

20 Claims, 37 Drawing Sheets

Related U.S. Application Data division of application No. 14/713,948, filed on May 15, 2015, now Pat. No. 9,419,003.

(51) Int. Cl.

| | | |
|---|---|---|
| *H01L 27/11* | (2006.01) |
| *H01L 29/04* | (2006.01) |
| *H01L 29/06* | (2006.01) |
| *H01L 29/45* | (2006.01) |
| *H01L 29/66* | (2006.01) |
| *H01L 29/78* | (2006.01) |
| *H01L 21/265* | (2006.01) |
| *H01L 23/522* | (2006.01) |
| *H01L 29/417* | (2006.01) |
| *H01L 29/775* | (2006.01) |
| *H01L 21/8238* | (2006.01) |

(52) U.S. Cl.
CPC ........... *H01L 21/823814* (2013.01); *H01L 21/823828* (2013.01); *H01L 23/5226* (2013.01); *H01L 27/0688* (2013.01); *H01L 27/1108* (2013.01); *H01L 29/04* (2013.01); *H01L 29/41741* (2013.01); *H01L 29/45* (2013.01); *H01L 29/66666* (2013.01); *H01L 29/7827* (2013.01); *H01L 21/823807* (2013.01); *H01L 21/823871* (2013.01); *H01L 21/823885* (2013.01); *H01L 29/0676* (2013.01); *H01L 29/775* (2013.01)

(56) References Cited

U.S. PATENT DOCUMENTS

| | | |
|---|---|---|
| 2014/0227846 A1 | 8/2014 | Liaw |
| 2014/0252455 A1 | 9/2014 | Chuang et al. |
| 2015/0063007 A1 | 3/2015 | Choi |
| 2015/0294714 A1 | 10/2015 | Pickering |
| 2015/0318290 A1 | 11/2015 | Liaw |
| 2016/0078922 A1 | 3/2016 | Liaw |

FOREIGN PATENT DOCUMENTS

| | | |
|---|---|---|
| KR | 20140111212 A | 9/2014 |
| TW | 201432681 A | 8/2014 |
| TW | 201432852 A | 8/2014 |
| TW | 201508764 A | 3/2015 |

OTHER PUBLICATIONS

Kamata, Yoshiki et al., "Superior Cut-Off Characteristics of Lg=40nm Wfin=7nm Poly Ge Junctionless Tri-gate FET for Stacked 3D Circuits Integration," 2013 Symposium on VLSI Technology Digest of Technical Papers, Jun. 11-13, 2013, pp. 1-2.

* cited by examiner

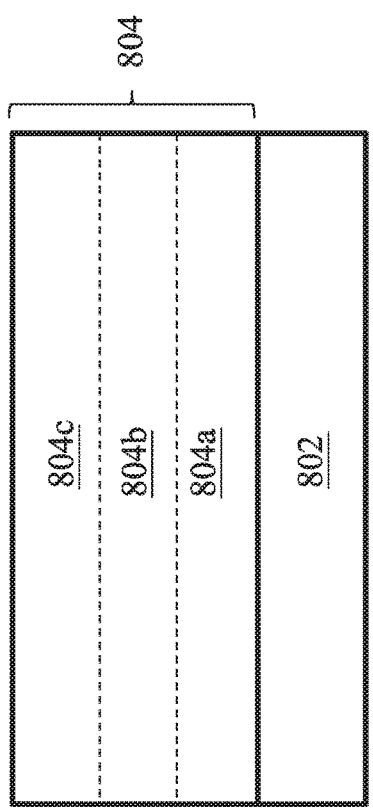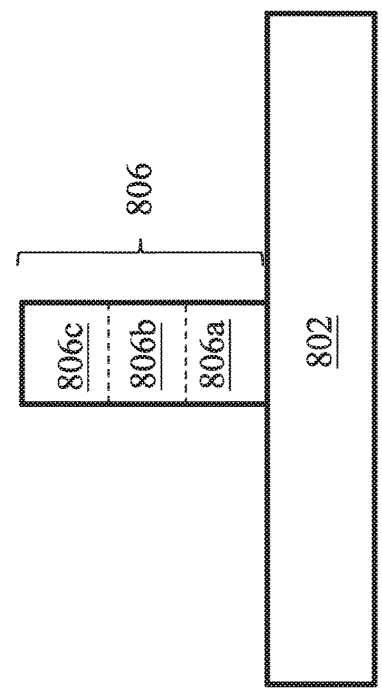

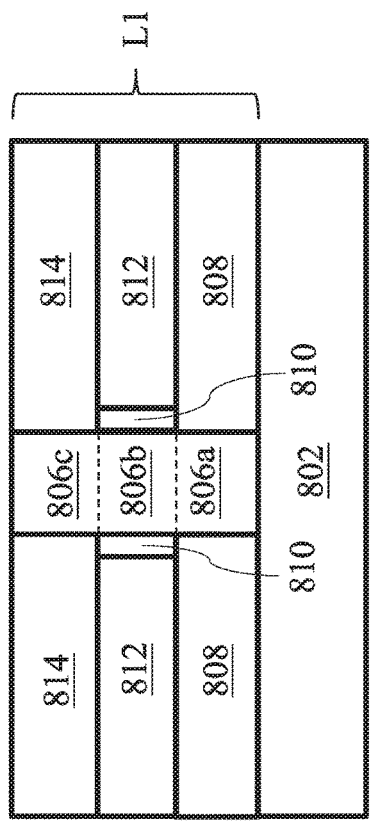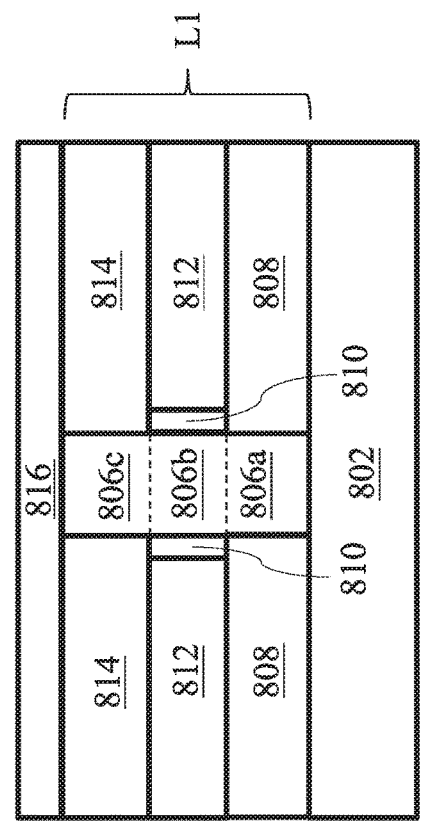

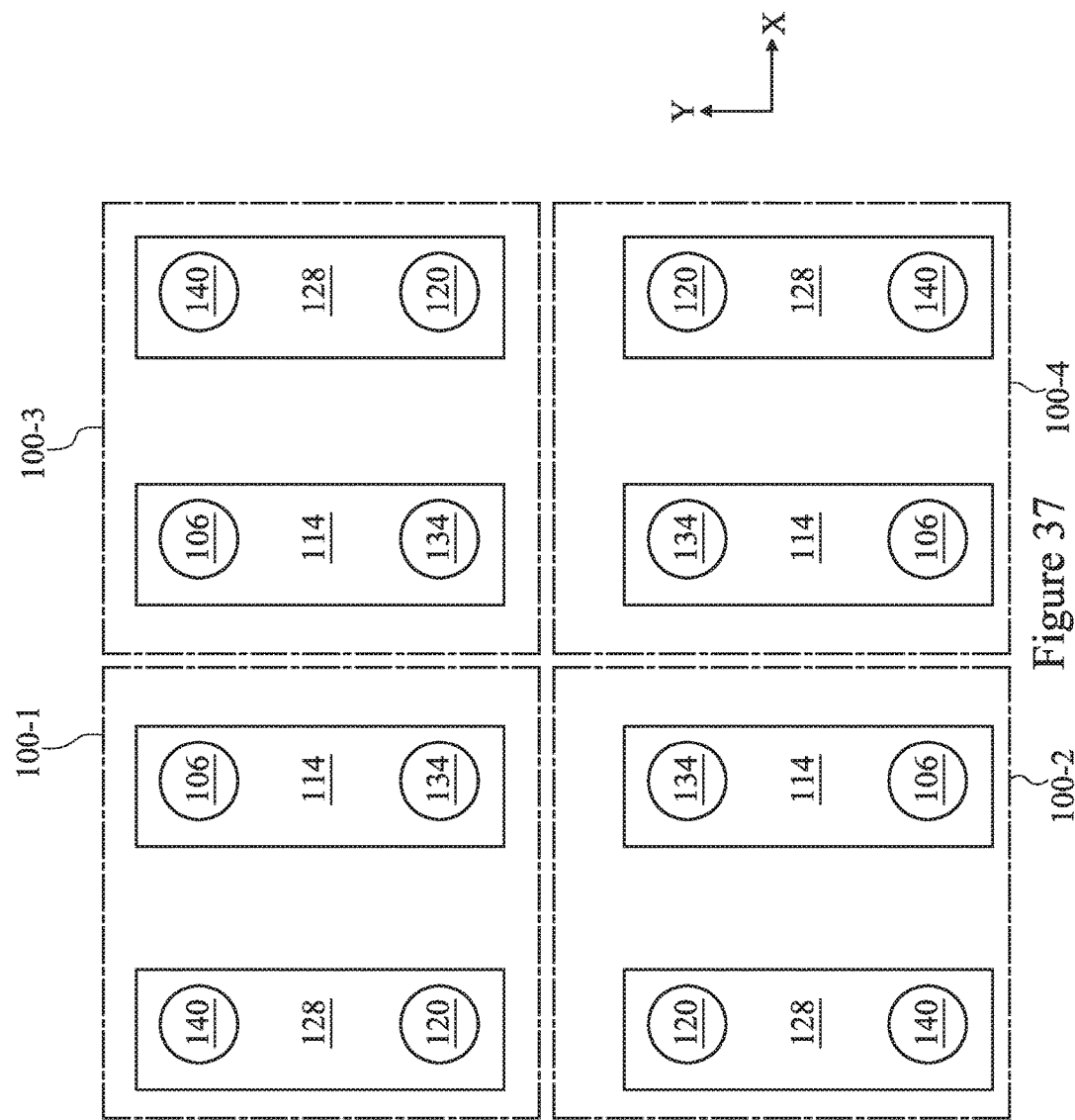

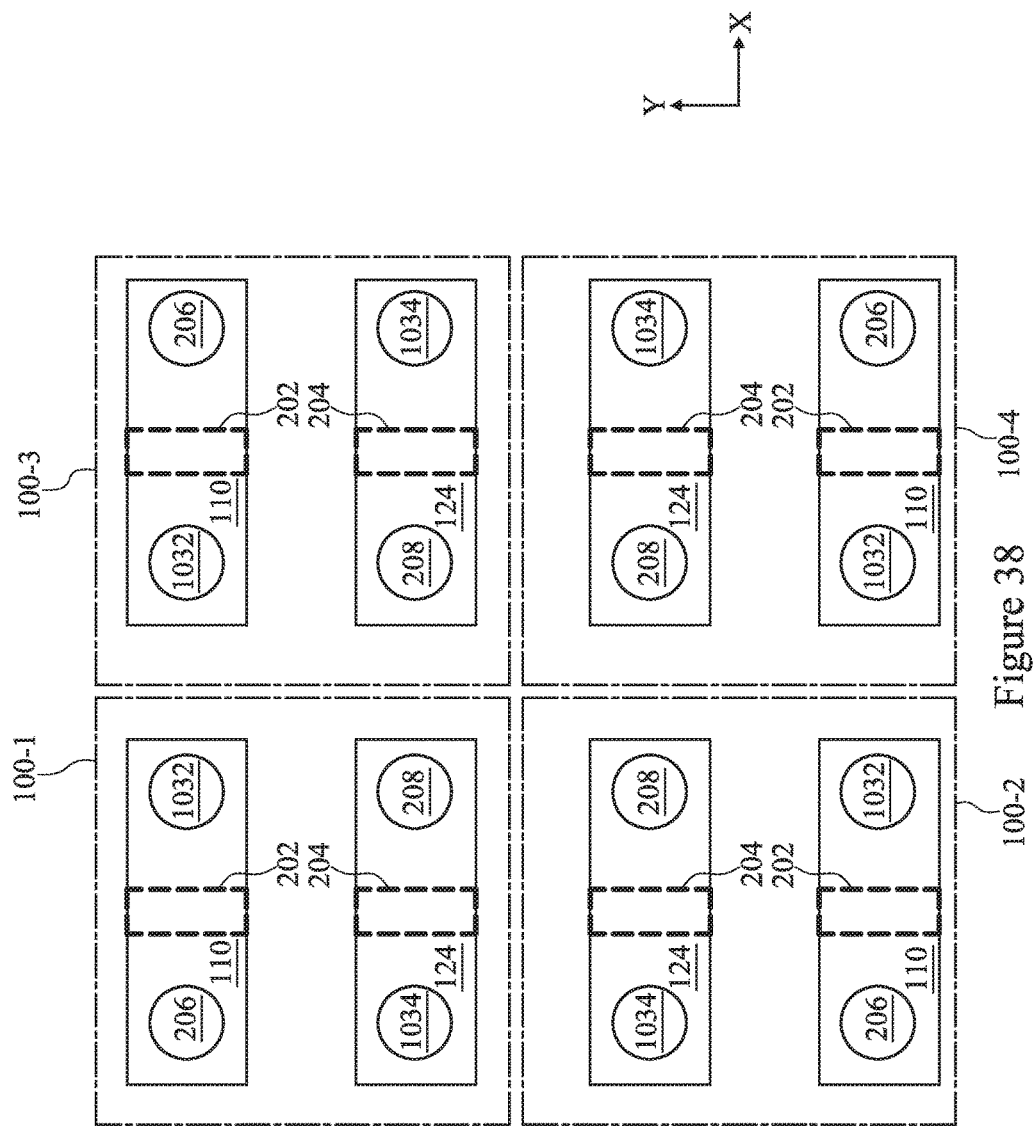

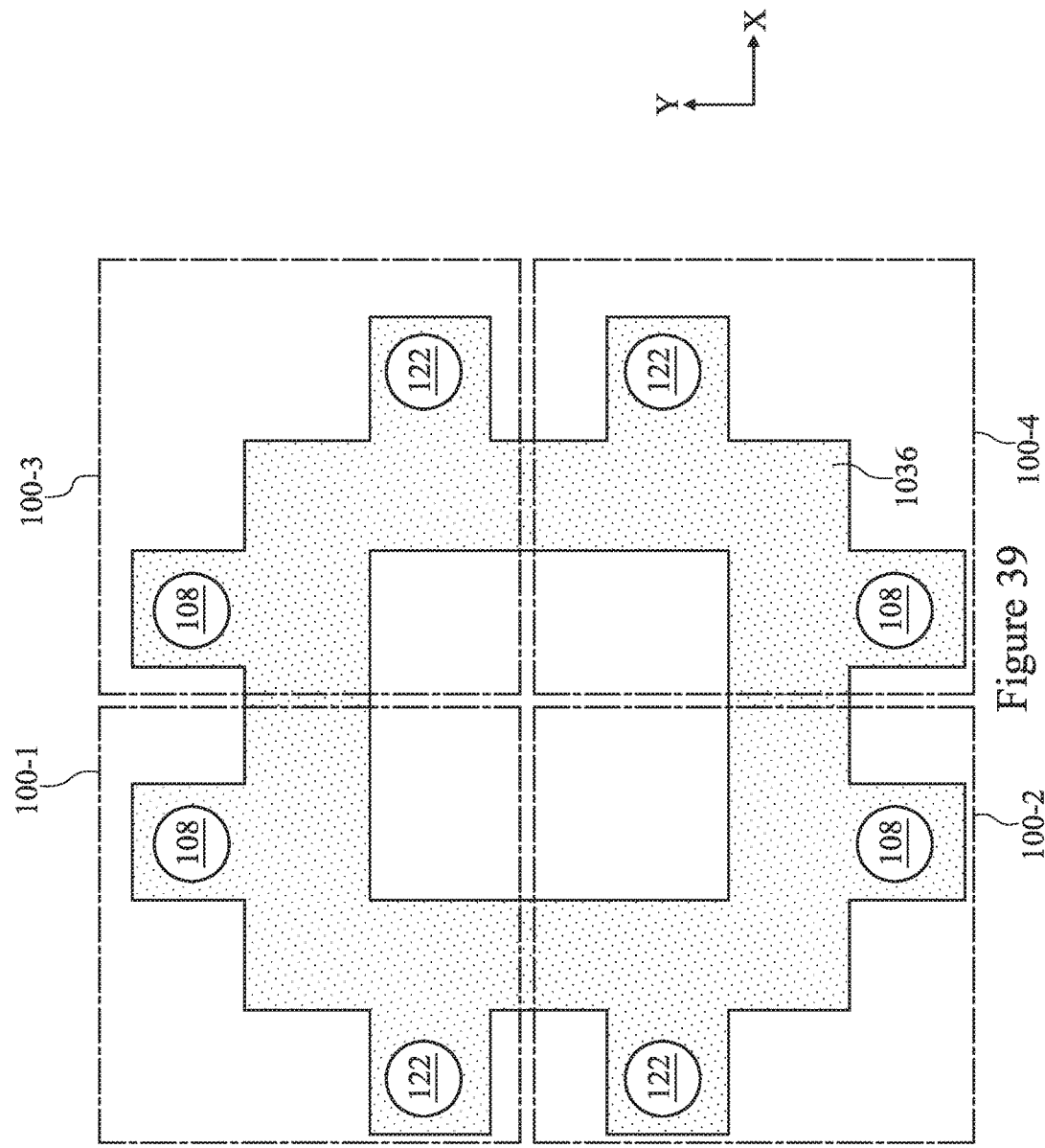

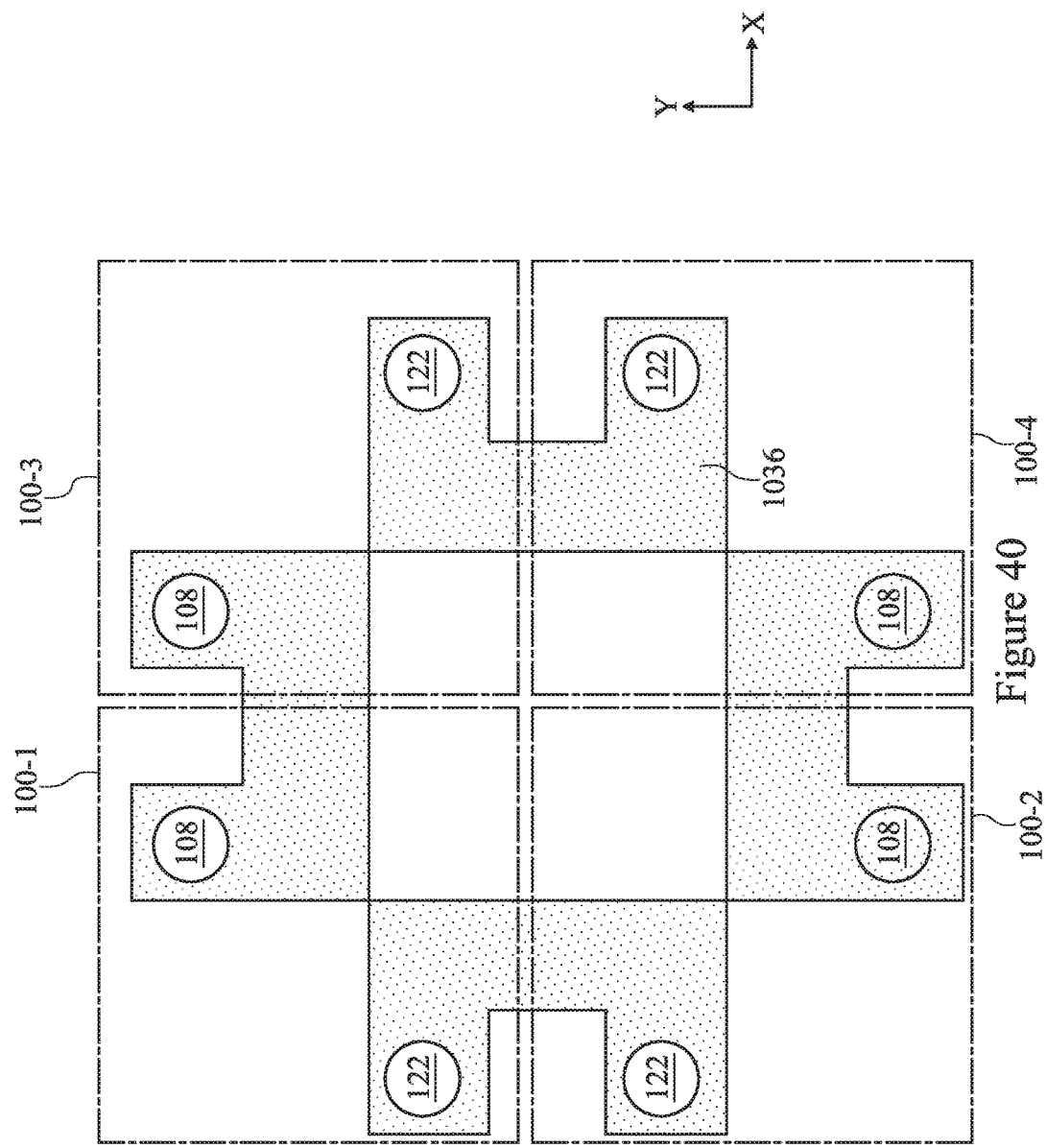

US 10,157,928 B2

SEMICONDUCTOR DEVICES AND METHODS OF MANUFACTURE THEREOF

PRIORITY CLAIM AND CROSS-REFERENCE

This application is a continuation of U.S. patent application Ser. No. 15/217,307, filed on Jul. 22, 2016, entitled "Semiconductor Devices and Methods of Manufacture Thereof," which is a divisional of U.S. patent application Ser. No. 14/713,948, filed on May 15, 2015, entitled "Semiconductor Devices and Methods of Manufacture Thereof," now issued as U.S. Pat. No. 9,419,003 on Aug. 16, 2016, which applications are incorporated herein by reference.

BACKGROUND

The semiconductor industry continues to improve the integration density of various integrated circuits by continual reductions in minimum feature size, which allow more electronic components (e.g., transistors, diodes, resistors, capacitors, etc.) to be integrated into a given area.

Static random access memory (SRAM) cells are also commonly used in integrated circuits. SRAM cells have the advantageous feature of holding data without a need for refreshing. As the integration density of integrated circuits improves, there is an increasing demand to reduce the footprint of SRAM cells and, consequently, increase the integration density of SRAM cells (e.g. increase the number of SRAM cells per unit area).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8 to 18 show a process flow illustrating some of the steps of a method of manufacturing an SRAM cell, in accordance with an embodiment.

FIG. 37 shows an overlaid top-down view of a trace level of the 2×2 array of SRAM cells shown in FIG. 31, in accordance with an embodiment.

FIG. 38 shows an overlaid top-down view of a channel-level and a drain level of a second active level of the 2×2 array of SRAM cells shown in FIG. 31, in accordance with an embodiment.

FIGS. 39 and 40 show overlaid top-down views of a source-level of a second active level of the 2×2 array of SRAM cells shown in FIG. 31, in accordance with an embodiment.

DETAILED DESCRIPTION

Figure 1:
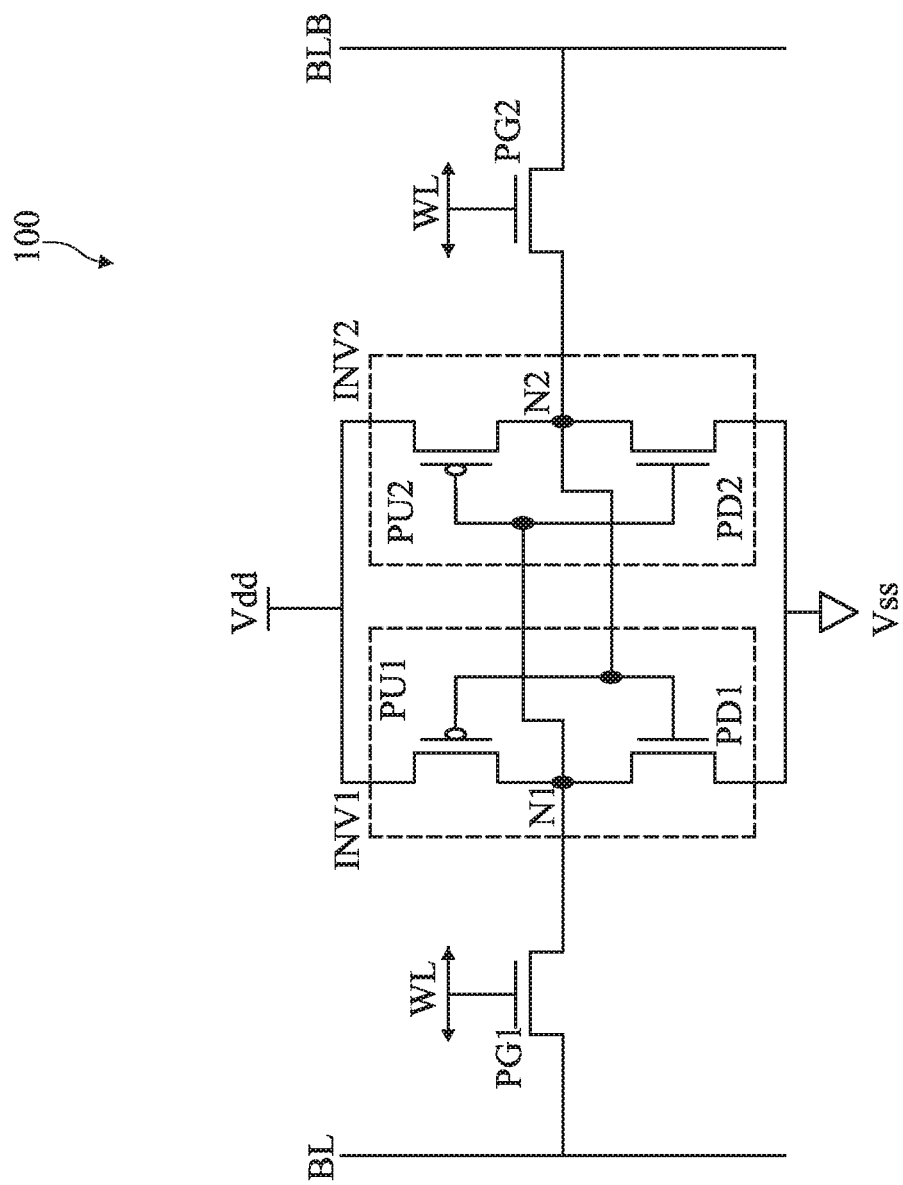
FIG. 1 shows a circuit diagram of a static random access memory (SRAM) cell, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) cells, such as SRAM cells comprising vertical transistors, are provided in accordance with various example embodiments. Some variations of the embodiments are discussed. Throughout the various views and illustrative embodiments, like reference numbers are used to designate like elements. Further, method embodiments discussed herein may be discussed as being performed in a particular order; however, other method embodiments may be performed in any logical order.

FIG. 1 illustrates a circuit diagram of an SRAM cell 100, in accordance with one or more embodiments. The SRAM cell 100 includes pull-up transistors PU1 and PU2, pull-down transistors PD1 and PD2, and pass-gate transistors PG1 and PG2, which may be included in a write portion of the SRAM cell 100. In some embodiments, the SRAM cell 100 may also include a read portion (not shown in FIG. 1) that may be electrically coupled to the pull-up transistors PU1 and PU2, pull-down transistors PD1 and PD2, and pass-gate transistors PG1 and PG2. As show in the circuit diagram, the pull-up transistors PU1 and PU2 are p-type transistors, while the pull-down transistors PD1, PD2 and the pass-gate transistors are n-type transistors.

As illustrated, the transistors PU1 and PD1 form a first inverter INV1 between a first power voltage Vdd and a second power voltage Vss (e.g. ground). The drains of the pull-up transistor PU1 and the pull-down transistor PD1 are coupled together, and the gates of the pull-up transistor PU1 and the pull-down transistor PD1 are coupled together. The transistors PU2 and PD2 form a second inverter INV2 between the first power voltage Vdd and the second power voltage Vss. The drains of the pull-up transistor PU2 and the pull-down transistor PD2 are coupled together, and the gates of the pull-up transistor PU2 and the pull-down transistor PD2 are coupled together. Sources of the pull-up transistors PU1 and PU2 are coupled to the first power voltage Vdd, while the sources of the pull-down transistors PD1 and PD2 are coupled to the second power voltage Vss.

As shown in FIG. 1, the inverters INV1 and INV2 are cross-coupled to form a data latch. For example, the gates of transistors PU1 and PD1 (which are coupled together) are further coupled to the drains of transistors PU2 and PD2. Similarly, the gates of transistors PU2 and PD2 (which are coupled together) are further coupled to the drains of transistors PU1 and PD1. Storage node N1 of the data latch is coupled to a bit line BL through the first pass-gate transistor PG1, and storage node N2 is coupled to a complementary bit line BLB through the second pass-gate transistor PG2. Storage nodes N1 and N2 are complementary nodes that are often at opposite logic levels (logic high or logic low). The gates of the first pass-gate transistor PG1 and the second pass-gate transistor PG2 are coupled to a write line WL.

The SRAM cell 100 may be a single SRAM cell. The pull-up transistors PU1 and PU2, the pull-down transistors PD1 and PD2, and the pass-gate transistors PG1 and PG2 included in the SRAM cell 100 may formed as vertical transistors in an effort to reduce the footprint of the SRAM cell 100 and, consequently, increase the integration density of a plurality of such SRAM cells 100. An example of the SRAM cell 100 having transistors PU1, PU2, PD1, PD2, PG1, and PG2 formed as vertical transistors is shown in FIG. 2.

Figure 2:
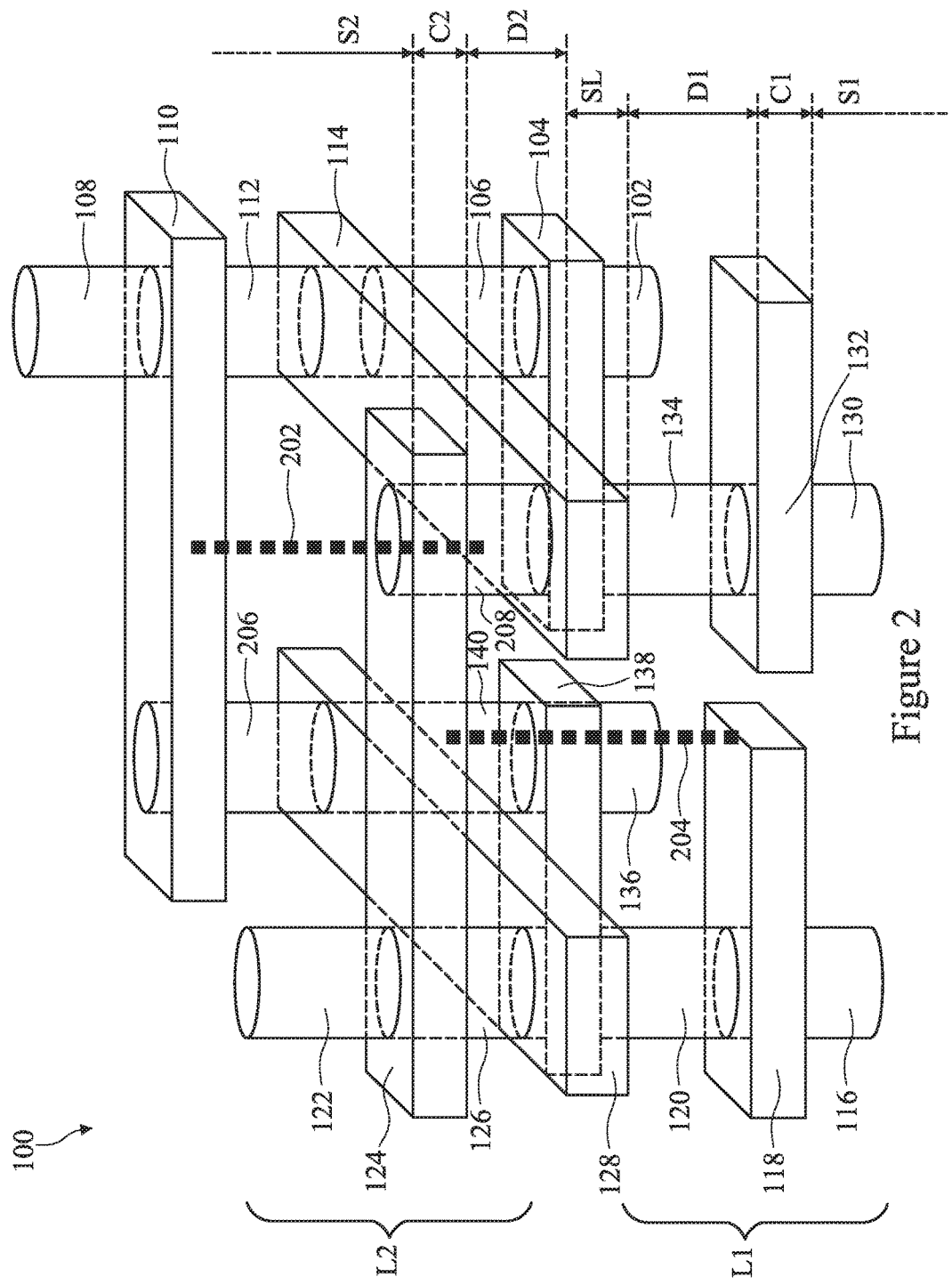
FIG. 2 shows a three-dimensional (3D) layout of an SRAM cell, in accordance with an embodiment.

FIG. 2 shows a three-dimensional (3D) layout of the SRAM cell 100, in accordance with one or more embodiments. The SRAM cell 100 includes the pull-down transistor PD1 (referred to as the first pull-down transistor PD1), which includes a source region 102, a drain region 106, and a channel region (not labeled in FIG. 2; see feature 806b in FIG. 9) disposed between the source region 102 and the drain region 106. It is noted that although elements 102 and 106 are referred to as source region and drain region, respectively, each of elements 102 and 106 may also be referred to as a source/drain region. The first pull-down transistor PD1 may be formed in a first active level L1. The first pull-down transistor PD1 may be a vertical transistor and thus, the source region 102, drain region 106, and channel region of the first pull-down transistor PD1 may be a vertical source, a vertical drain, and a vertical channel, respectively. As shown in FIG. 2, the channel region of the first pull-down transistor PD1 may be formed above the source region 102, while the drain region 106 may be formed above the channel region.

The first pull-down transistor PD1 also includes a gate electrode 104 (hereinafter referred to as "gate 104" for brevity) around (e.g. wrapped around) the channel region of the first pull-down transistor PD1. As an example, the gate 104 of the first pull-down transistor PD1 may be formed as a conductive feature having a first portion that wraps around the channel region of the first pull-down transistor PD1, while a second portion of the gate 104 extends away from the channel region of the first pull-down transistor PD1, as shown in FIG. 2. The gate 104 of the first pull-down transistor PD1 may include a metal-containing material such as TiN, TaN, TiAl, TaAl, a Ti-containing material, a Ta-containing material, an Al-containing material, a W-containing material, TiSi, NiSi, PtSi, polysilicon with a silicide, a Cu-containing material, a refractory material, the like, combinations thereof, or multi-layers thereof. The first pull-down transistor PD1 may include a dielectric material (see description below in respect of FIG. 11) disposed between the gate 104 and the channel region of the first pull-down transistor PD1.

In an embodiment, the first pull-down transistor PD1 may be a junction transistor. For example, the source region 102 and the drain region 106 may comprise a semiconductor material that also comprises dopants that causes source region 102 and the drain region 106 to have a first conductivity (e.g. n-type). On the other hand, the channel region disposed between the source region 102 and the drain region 106 may comprise a semiconductor material that comprises dopants that causes the channel region to have a second conductivity (e.g. p-type) that is different from the first conductivity.

The source region 102, the channel region, and the drain region 106 may comprise any suitable semiconductor material, such as silicon, germanium, silicon germanium, combinations of these, or the like. For example, in an embodiment, each of the source region 102 and the drain region 106 comprises doped silicon, while the channel region comprises undoped (or lightly doped) silicon. However, in another embodiment, the channel region may comprise doped silicon, while the source region 102 and the drain region 106 comprise doped silicon germanium. In an embodiment in which the first pull-down transistor PD1 is an n-type transistor, the source region 102 and the drain region 106 may be doped with N-type dopants such as phosphorous or arsenic, while the channel region may be doped with P-type dopants such as boron or gallium.

In an embodiment, the dopant concentration of the source region 102 and the drain region 106 may be greater than the dopant concentration of the channel region. For example, the dopant concentration of the source region 102 and the drain region 106 may be in a range from about $1 \times 10^{20}$ cm$^{-3}$ to about $2 \times 10^{21}$ cm$^{-3}$ or even greater, while the dopant concentration of the channel region disposed between the source region 102 and the drain region 106 may be less than about $1 \times 10^{18}$ cm$^{-3}$.

In another embodiment, the first pull-down transistor PD1 may be a junctionless transistor. In such an example, the drain region 106, the source region 102, and the channel region of the first pull-down transistor PD1 may comprise a polycrystalline semiconductor material such as silicon, germanium, silicon germanium, combinations of these, or the like. The polycrystalline semiconductor material of the drain region 106, the source region 102, and the channel region of the first pull-down transistor PD1 may have the same conductivity (e.g. n-type).

The SRAM cell 100 includes the pull-up transistor PU1 (referred to as the first pull-up transistor PU1), which includes a source region 108, a drain region 112, and a channel region (not labeled in FIG. 2; see description below in respect of FIG. 16) disposed between the source region 108 and the drain region 112. It is noted that although elements 108 and 112 are referred to as source region and drain region, respectively, each of elements 108 and 112 may also be referred to as a source/drain region. The first pull-up transistor PU1 may be formed in a second active level L2 different from the first active layer L1. As an example, the second active level L2 may be above the first active level L1.

Consequently, the first pull-up transistor PU1 may be formed above the first pull-down transistor PD1. As an example, the first pull-up transistor PU1 may be stacked over the first pull-down transistor PD1.

In some embodiments, the first pull-up transistor PU1 may be self-aligned with the first pull-down transistor PD1 (e.g. see description below in respect of FIGS. 19-30). However, in other embodiments, the first pull-up transistor PU1 may not be self-aligned with the first pull-down transistor PD1 (e.g. see description below in respect of FIGS. 8-18). The first pull-up transistor PU1 may be a vertical transistor and thus, the source region 108, drain region 112, and channel region of the first pull-up transistor PU1 may be a vertical source, a vertical drain, and a vertical channel, respectively. As shown in FIG. 2, the channel region of the first pull-up transistor PU1 may be formed above the drain region 112, while the source region 108 may be formed above the channel region of the first pull-up transistor PU1. Furthermore, as shown in FIG. 2, the drain region 112 of the first pull-up transistor PU1 may be formed above the drain region 106 of the first pull-down transistor PD1.

The first pull-up transistor PU1 also includes a gate electrode 110 (hereinafter referred to as "gate 110" for brevity) around (e.g. wrapped around) the channel region of the first pull-up transistor PU1. As an example, the gate 110 of the first pull-up transistor PU1 may be formed as a conductive feature having a first portion that wraps around the channel region of the first pull-up transistor PU1, while a second portion of the gate 110 may extend away from the channel region of the first pull-up transistor PU1, as shown in FIG. 2. The gate 110 of the first pull-up transistor PU1 may comprise similar materials as the gate 104 of the first pull-down transistor PD1. The first pull-up transistor PU1 may include a dielectric material (see description below in respect of FIG. 16) disposed between the gate 110 and the channel region of the first pull-up transistor PU1.

In some embodiments, the first pull-up transistor PU1 may be a junctionless transistor. In such an example, the drain region 112, the source region 108, and the channel region of the first pull-up transistor PU1 may comprise a polycrystalline semiconductor material such as silicon, germanium, silicon germanium, combinations of these, or the like. The polycrystalline semiconductor material of the drain region 112, the source region 108, and the channel region of the first pull-up transistor PU1 may have the same conductivity (e.g. p-type).

As shown in FIG. 1, the drains of the first pull-up transistor PU1 and the first pull-down transistor PD1 are coupled together. This may be accomplished by a first conductive trace 114 disposed between the drain region 112 of the first pull-up transistor PU1 and the drain region 106 of the first pull-down transistor PD1, as shown in FIG. 2. The first conductive trace 114 may be disposed between the first active level L1 and the second active level L2. The first conductive trace 114 may contact (e.g. physically and/or electrically contact) each of the drain regions 106 and 112, thereby electrically coupling the drains of the first pull-up transistor PU1 and the first pull-down transistor PD1 together. The first conductive trace 114 may comprise suitable conductive materials such as copper, tungsten, combinations thereof or the like. Alternatively or additionally, the first conductive trace 114 may comprise a silicide, such as a silicide of cobalt, titanium, nickel, palladium, platinum, erbium, combinations of these, or the like.

As shown in FIG. 1, the gates of the first pull-up transistor PU1 and the first pull-down transistor PD1 are coupled together. This may be accomplished by a first via 202 (shown in FIG. 2 as dotted line 202) that may contact (e.g. physically and/or electrically contact) the gate 110 (e.g. second portion of the gate 110) of the first pull-up transistor PU1 and the gate 104 (e.g. second portion of the gate 104) of the first pull-down transistor PD1, thereby electrically coupling the gates of the first pull-up transistor PU1 and the first pull-down transistor PD1 together. In some embodiments, the first via 202 may comprise a silicide (e.g. including similar materials as the first conductive trace 114). In other embodiments, the first via 202 may comprise a metal-containing material (e.g. including similar materials as the gate 104 of the first pull-down transistor PD1).

As shown in FIG. 1, the sources of the first pull-up transistor PU1 and the first pull-down transistor PD1 may be coupled to the first power voltage Vdd and the second power voltage Vss, respectively. Consequently, the source regions 108 and 102 of the first pull-up transistor PU1 and the first pull-down transistor PD1 shown in FIG. 2 may be electrically coupled to the first power voltage Vdd and the second power voltage Vss, respectively. This may be accomplished by the use of metal lines and/or vias (not shown in FIG. 2; see description below in respect of FIGS. 33, 39, and 40).

The SRAM cell 100 includes the pull-down transistor PD2 (referred to as the second pull-down transistor PD2), which includes a source region 116, a drain region 120, and a channel region (not labeled in FIG. 2; see feature 806b in FIG. 9) disposed between the source region 116 and the drain region 120. It is noted that although elements 116 and 120 are referred to as source region and drain region, respectively, each of elements 116 and 120 may also be referred to as a source/drain region. The second pull-down transistor PD2 may be formed in the first active level L1. The second pull-down transistor PD2 may be a vertical transistor and thus, the source region 116, drain region 120, and channel region of the second pull-down transistor PD2 may be a vertical source, a vertical drain, and a vertical channel, respectively. As shown in FIG. 2, the channel region of the second pull-down transistor PD2 may be formed above the source region 116, while the drain region 120 may be formed above the channel region of the second pull-down transistor PD2.

The second pull-down transistor PD2 also includes a gate electrode 118 (hereinafter referred to as "gate 118" for brevity) around (e.g. wrapped around) the channel region of the second pull-down transistor PD2. As an example, the gate 118 of the second pull-down transistor PD2 may be formed as a conductive feature having a first portion that wraps around the channel region of the second pull-down transistor PD2, while a second portion of the gate 118 extends away from the channel region of the second pull-down transistor PD2, as shown in FIG. 2. The gate 118 of the second pull-down transistor PD2 may include similar materials as the gate 104 of the first pull-down transistor PD1. The second pull-down transistor PD2 may include a dielectric material (see description below in respect of FIG. 11) disposed between the gate 118 and the channel region of the second pull-down transistor PD2.

In an embodiment, the second pull-down transistor PD2 may be a junction transistor (e.g. similar to the junction transistor described above in relation to the first pull-down transistor PD1). In another embodiment, the second pull-down transistor PD2 may be a junctionless transistor (e.g. similar to the junctionless transistor described above in relation to the first pull-down transistor PD1). The second pull-down transistor PD2 may have the same conductivity as the first pull-down transistor PD1 (e.g. n-type). The source region 116, drain region 120, and channel region of the second pull-down transistor PD2 may respectively comprise similar materials, dopants, and/or dopant concentrations as the source region 102, drain region 106, and channel region of the first pull-down transistor PD1.

The SRAM cell 100 may include the pull-up transistor PU2 (referred to as the second pull-up transistor PU2). As shown in FIG. 2, the second pull-up transistor PU2 is formed in the second active level L2. Consequently, the second pull-up transistor PU2 may be formed above the second pull-down transistor PD2. As an example, the second pull-up transistor PU2 may be stacked over the second pull-down transistor PD2. In some embodiments, the second pull-up transistor PU2 may be self-aligned with the second pull-down transistor PD2 (e.g. see description below in respect of FIGS. 19-30). However, in other embodiments, the second pull-up transistor PU2 may not be self-aligned with the second pull-down transistor PD2 (e.g. see description below in respect of FIGS. 8-18).

The second pull-up transistor PU2 includes a source region 122, a drain region 126, and a channel region (not labeled in FIG. 2; see description below in respect of FIG. 16) disposed between the source region 122 and the drain region 126. It is noted that although elements 122 and 126 are referred to as source region and drain region, respectively, each of elements 122 and 126 may also be referred to as a source/drain region. The second pull-up transistor PU2 may be a vertical transistor and thus, the source region 122, drain region 126, and channel region of the second pull-up transistor PU2 may be a vertical source, a vertical drain, and a vertical channel, respectively. As shown in FIG. 2, the channel region of the second pull-up transistor PU2 may be formed above the drain region 126, while the source region 122 may be formed above the channel region of the second pull-up transistor PU2. Furthermore, as shown in FIG. 2, the drain region 126 of the second pull-up transistor PU2 may be formed above the drain region 120 of the second pull-down transistor PD2.

The second pull-up transistor PU2 also includes a gate electrode 124 (hereinafter referred to as "gate 124" for brevity) around (e.g. wrapped around) the channel region of the second pull-up transistor PU2. As an example, the gate 124 of the second pull-up transistor PU2 may be formed as a conductive feature having a first portion that wraps around the channel region of the second pull-up transistor PU2, while a second portion of the gate 124 may extend away from the channel region of the second pull-up transistor PU2, as shown in FIG. 2. The gate 124 of the second pull-up transistor PU2 may comprise similar materials as the gate 104 of the first pull-down transistor PD1. The second pull-up transistor PU2 may include a dielectric material (see description below in respect of FIG. 16) disposed between the gate 124 and the channel region of the second pull-up transistor PU2.

In some embodiments, the second pull-up transistor PU2 may be a junctionless transistor (e.g. similar to the junctionless transistor described above in relation to the first pull-up transistor PU1). The second pull-up transistor PU2 may have the same conductivity as the first pull-up transistor PU1 (e.g. p-type). The source region 122, drain region 126, and channel region of the second pull-up transistor PU2 may respectively comprise similar materials, dopants, and/or dopant concentrations as the source region 108, drain region 106, and channel region of the first pull-up transistor PU1.

As shown in FIG. 1, the drains of the second pull-up transistor PU2 and the second pull-down transistor PD2 are coupled together. This may be accomplished by a second conductive trace 128 disposed between the drain region 126 of the second pull-up transistor PU2 and the drain region 120 of the second pull-down transistor PD2, as shown in FIG. 2. The second conductive trace 128 may be disposed between the first active level L1 and the second active level L2. The second conductive trace 128 may contact (e.g. physically and/or electrically contact) each of the drain regions 120 and 126, thereby electrically coupling the drains of the second pull-up transistor PU2 and the second pull-down transistor PD2 together. The second conductive trace 128 may comprise similar materials as the first conductive trace 114.

As shown in FIG. 1, the gates of the second pull-up transistor PU2 and the second pull-down transistor PD2 are coupled together. This may be accomplished by a second via 204 (shown in FIG. 2 as dotted line 204) that may contact (e.g. physically and/or electrically contact) the gate 124 (e.g. second portion of the gate 124) of the second pull-up transistor PU2 and the gate 118 (e.g. second portion of the gate 118) of the second pull-down transistor PD2, thereby electrically coupling the gates of the second pull-up transistor PU2 and the second pull-down transistor PD2 together. In some embodiments, the second via 204 may comprise similar materials as the first via 202.

As shown in FIG. 1, the sources of the second pull-up transistor PU2 and the second pull-down transistor PD2 may be coupled to the first power voltage Vdd and the second power voltage Vss, respectively. Consequently, the source regions 122 and 116 of the second pull-up transistor PU2 and the second pull-down transistor PD2 shown in FIG. 2 may be electrically coupled to the first power voltage Vdd and the second power voltage Vss, respectively. This may be accomplished by the use of metal lines and/or vias (not shown in FIG. 2; see description below in respect of FIGS. 33, 39, and 40).

The SRAM cell 100 includes the first pass-gate transistor PG1 and the second pass-gate transistor PG2. The pass-gate transistors PG1 and PG2 may be formed in the same active level as the first pull-down transistor PD1 and the second pull-down transistor PD2. As shown in FIG. 2, the first pull-down transistor PD1 and the second pull-down transistor PD2 may be respectively formed in a first active area and a second active area of the first active level L1, while the first pass-gate transistor PG1 and the second pass-gate transistor PG2 may be respectively formed in a third active area and a fourth active area of the first active level L1.

The first pass-gate transistor PG1 includes a source region 130, a drain region 134, and a channel region (not labeled in FIG. 2; see feature 806b in FIG. 9) disposed between the source region 130 and the drain region 134. It is noted that although elements 130 and 134 are referred to as source region and drain region, respectively, each of elements 130 and 134 may also be referred to as a source/drain region. The first pass-gate transistor PG1 may be a vertical transistor and thus, the source region 130, drain region 134, and channel region of the first pass-gate transistor PG1 may be a vertical source, a vertical drain, and a vertical channel, respectively. As shown in FIG. 2, the channel region of the first pass-gate transistor PG1 may be formed above the source region 130, while the drain region 134 may be formed above the channel region of the first pass-gate transistor PG1. The source region 130, drain region 134, and channel region of the first pass-gate transistor PG1 may comprise similar materials, dopants, and/or dopant concentrations as the first pull-down transistor PD1 or the second pull-down transistor PD2.

The first pass-gate transistor PG1 also includes a gate electrode 132 (hereinafter referred to as "gate 132" for brevity) around (e.g. wrapped around) the channel region of the first pass-gate transistor PG1. As an example, the gate 132 of the first pass-gate transistor PG1 may be formed as a conductive feature having a first portion that wraps around the channel region of the first pass-gate transistor PG1, while a second portion of the gate 132 may extend away from the channel region of the first pass-gate transistor PG1, as shown in FIG. 2. The gate 132 of the first pass-gate transistor PG1 may include similar materials as the gate 104 of the first pull-down transistor PD1. The first pass-gate transistor PG1 may include a dielectric material (see description below in respect of FIG. 11) disposed between the gate 132 and the channel region of the first pass-gate transistor PG1.

As shown in FIG. 1, the gates of the first pull-up transistor PU1 and the first pull-down transistor PD1 are coupled to the gate of the first pass-gate transistor PG1. This may be accomplished using the first conductive trace 114, as shown in FIG. 2. Illustratively, the first conductive trace 114 may have a first portion disposed between the drains 112 and 106 of the first pull-up transistor PU1 and the first pull-down transistor PD1. The first conductive trace 114 may additionally have a second portion that extends over the drain region 134 of the first pass-gate transistor PG1. The second portion of the first conductive trace 114 may contact (e.g. physically and/or electrically contact) the drain region 134 of the first pass-gate transistor PG1, thereby electrically coupling the gates of the first pull-up transistor PU1 and the first pull-down transistor PD1 to the gate of the first pass-gate transistor PG1.

As shown in FIG. 1, the gate of the first pass-gate transistor PG1 is coupled to the write line WL, while the source of the first pass-gate transistor PG1 is coupled to the bit line BL. Illustratively, the source region 130 of the first pass-gate transistor PG1 may be electrically coupled to the bit line BL by the use of metal lines and/or vias (not shown in FIG. 2; see description below in respect of FIGS. 33 and 34). Furthermore, the gate 132 of the first pass-gate transistor PG1 may be electrically coupled to the write line WL by the use of electrically conductive layers and/or vias (not shown in FIG. 2; see description below in respect of FIG. 36).

The second pass-gate transistor PG2 includes a source region 136, a drain region 140, and a channel region (not labeled in FIG. 2; see feature 806b in FIG. 9) disposed between the source region 136 and the drain region 140. It is noted that although elements 136 and 140 are referred to as source region and drain region, respectively, each of elements 136 and 140 may also be referred to as a source/drain region. The second pass-gate transistor PG2 may be a vertical transistor and thus, the source region 136, drain region 140, and channel region of the second pass-gate transistor PG2 may be a vertical source, a vertical drain, and a vertical channel, respectively. As shown in FIG. 2, the channel region of the second pass-gate transistor PG2 may be formed above the source region 136, while the drain region 140 may be formed above the channel region of the second pass-gate transistor PG2. The source region 136, drain region 140, and channel region of the second pass-gate transistor PG2 may comprise similar materials, dopants, and/or dopant concentrations as the first pull-down transistor PD1 or the second pull-down transistor PD2.

The second pass-gate transistor PG2 also includes a gate electrode 138 (hereinafter referred to as "gate 138" for brevity) around (e.g. wrapped around) the channel region of the second pass-gate transistor PG2. As an example, the gate 138 of the second pass-gate transistor PG2 may be formed as a conductive feature having a first portion that wraps around the channel region of the second pass-gate transistor PG2, while a second portion of the gate 138 may extend away from the channel region of the second pass-gate transistor PG2, as shown in FIG. 2. The gate 138 of the second pass-gate transistor PG2 may include similar materials as the gate 104 of the first pull-down transistor PD1. The second pass-gate transistor PG2 may include a dielectric material (see description below in respect of FIG. 11) disposed between the gate 138 and the channel of the second pass-gate transistor PG2.

As shown in FIG. 1, the gates of the second pull-up transistor PU2 and the second pull-down transistor PD2 are coupled to the gate of the second pass-gate transistor PG2. This may be accomplished using the second conductive trace 128, as shown in FIG. 2. Illustratively, the second conductive trace 128 may have a first portion disposed between the drains 126 and 120 of the second pull-up transistor PU2 and the second pull-down transistor PD2. The second conductive trace 128 may additionally have a second portion that extends over the drain region 140 of the second pass-gate transistor PG2. The second portion of the second conductive trace 128 may contact (e.g. physically and/or electrically contact) the drain region 140 of the second pass-gate transistor PG2, thereby electrically coupling the gates of the second pull-up transistor PU2 and the second pull-down transistor PD2 to the gate of the second pass-gate transistor PG2.

As shown in FIG. 1, the gate of the second pass-gate transistor PG2 is coupled to the write line WL, while the source of the second pass-gate transistor PG2 is coupled to the complementary bit line BLB. Illustratively, the source region 136 of the second pass-gate transistor PG2 may be electrically coupled to the complementary bit line BL by the use of metal lines and/or vias (not shown in FIG. 2; see description below in respect of FIGS. 33 and 34). Furthermore, the gate 138 of the second pass-gate transistor PG2 may be electrically coupled to the write line WL by the use of electrically conductive layers and/or vias (not shown in FIG. 2).

As shown in FIG. 1, the data latch is formed by coupling the gates of transistors PU1 and PD1 to the drains of transistors PU2 and PD2. This may be accomplished using a third via 206 and the second conductive trace 128, as shown in FIG. 2. For example, the second portion of the gate 110 of the first pull-up transistor PU1 may further extend over the second portion of the second conductive trace 128 that contacts the drain region 140 of the second pass-gate transistor PG2. The third via 206 may be located between the second portion of the gate 110 and the second portion of the second conductive trace 128 and may couple the gate 110 and the second conductive trace 128 to each other, thereby coupling the gates of transistors PU1 and PD1 to the drains of transistors PU2 and PD2. The third via 206 may be formed in the second active level L2 and may comprise similar materials as the gate 104 of the first pull-down transistor PD1. Consequently, an additional via level may be used to make contact between the gates of the pull-up transistors PU1, PU2 and the gates of the pull-down transistors PD1, PD2. In some embodiments, the third via 206 may be self-aligned with the second pass-gate transistor PG2 (e.g. see description below in respect of FIGS. 19-30). However, in other embodiments, the third via 206 may not be self-aligned with the second pass-gate transistor PG2 (e.g. see description below in respect of FIGS. 8-18).

Similarly, the data latch is formed by coupling the gates of transistors PU2 and PD2 to the drains of transistors PU1 and PD1. This may be accomplished using a fourth via 208 and the first conductive trace 114, as shown in FIG. 2. For example, the second portion of gate 124 of the second pull-up transistor PU2 may further extend over the second portion of the first conductive trace 114 that contacts the drain region 134 of the first pass-gate transistor PG1. The fourth via 208 may be located between the second portion of the gate 124 and the second portion of the first conductive trace 114 and may couple the gate 124 and the first conductive trace 114 to each other, thereby coupling the gates of transistors PU2 and PD2 to the drains of transistors PU1 and PD1. The fourth via 208 may be formed in the second active level L2 and may comprise similar materials as the gate 104 of the first pull-down transistor PD1. Consequently, an additional via level may be used to make contact between the gates of the pull-up transistors PU1, PU2 and the gates of the pull-down transistors PD1, PD2. In some embodiments, the fourth via 208 may be self-aligned with the first pass-gate transistor PG1 (e.g. see description below in respect of FIGS. 19-30). However, in other embodiments, the fourth via 208 may not be self-aligned with the first pass-gate transistor PG1 (e.g. see description below in respect of FIGS. 8-18).

Figure 3:
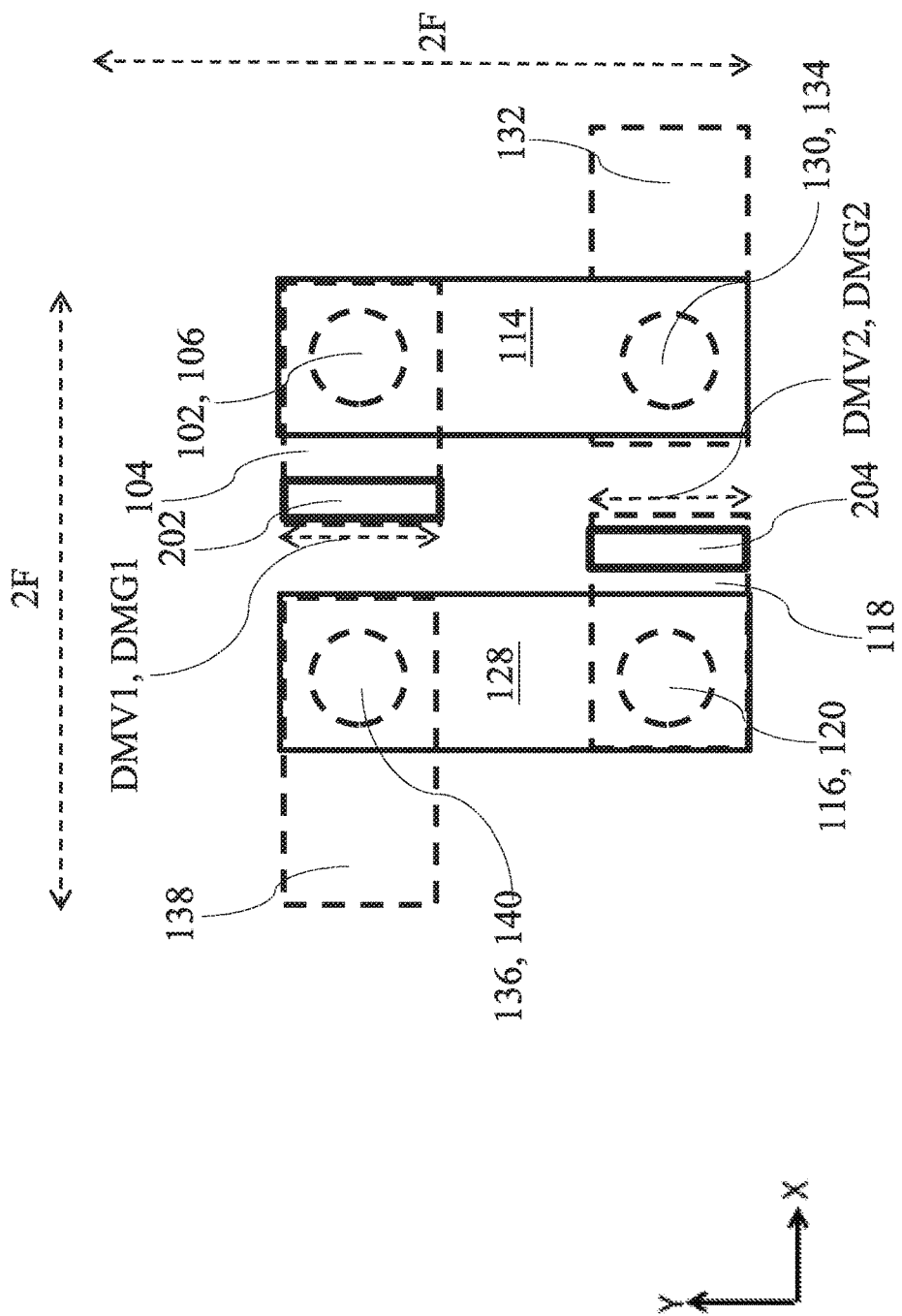
FIGS. 3 and 4 show overlaid top-down views of the SRAM cell shown in FIG. 2, in accordance with an embodiment.
Figure 4:
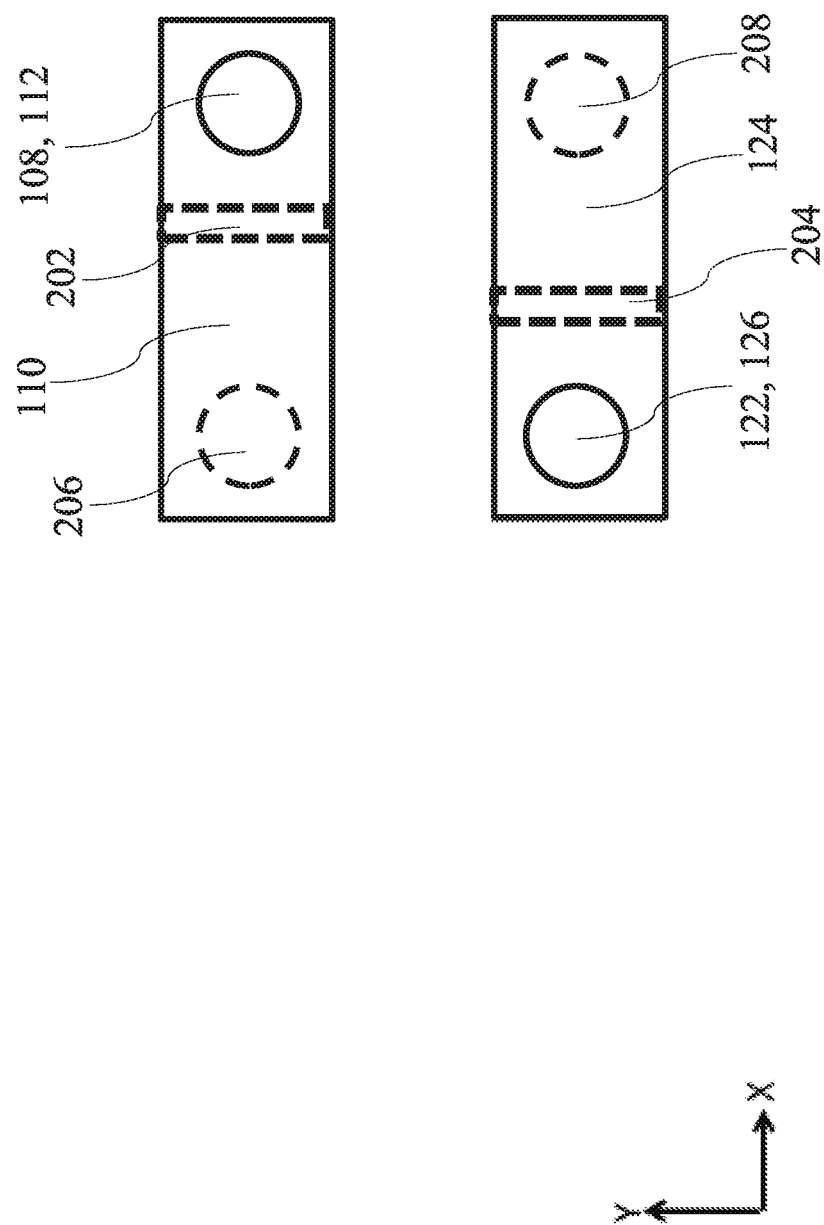

FIG. 3 shows an overlaid top-down view of the first active level L1, the first conductive trace 114 and the second conductive trace 128 of the SRAM cell 100 shown in FIG. 2, in accordance with one or more embodiments. FIG. 4 shows an overlaid top-down view of the second active level L2 of the SRAM cell 100 shown in FIG. 2, in accordance with one or more embodiments. As indicated in FIG. 3, the single SRAM cell 100 has a first width of about 2 F and a second width of about 2 F, where F is a minimum printable pitch of the SRAM cell 100. Consequently, the footprint of the SRAM cell 100 is about 4 $F^2$. Current single SRAM cell designs with vertical transistors have a footprint of about 10 $F^2$. Consequently, the SRAM cell 100 having the layout shown in FIGS. 2 to 4 has a reduced footprint compared to current SRAM cell designs (e.g. reduced by about 60%). Consequently, the integration density of a plurality of such SRAM cells 100 can be increased.

As illustrated in FIG. 3, a dimension DMV1 (e.g. a width) of the first via 202 may be substantially equal to a dimension DMG1 (e.g. a width) of the gate 104 of the first pull-down transistor PD1. Furthermore, a dimension DMV2 (e.g. a width) of the second via 204 may be substantially equal to a dimension DMG2 (e.g. a width) of the gate 118. FIGS. 3 and 4 also show the relative positions of the first pull-down transistor PD1, the second pull-down transistor PD2, the first pass-gate transistor PG1, and the second pass-gate transistor PG2 in a top-down view. The relative positions of these transistors may also observed in FIG. 2. For example, the first pass-gate transistor PG1 may be laterally separated from the first pull-down transistor PD1 along a first direction (e.g. along a Y-direction) by a first distance (e.g. a distance substantially equal to F), while the second pass-gate transistor PG2 may be laterally separated from the first pull-down transistor PD1 along a second direction substantially perpendicular to the first direction (e.g. along an X-direction) by substantially the first distance. Furthermore, the second pull-down transistor PD2 may be laterally separated from the first pass-gate transistor PG1 along the second direction (e.g. along the X-direction) by substantially the first distance. It also follows that the second pull-down transistor PD2 may be laterally separated from the second pass-gate transistor PG2 along the first direction (e.g. along the Y-direction) by substantially the first distance.

Figure 5:
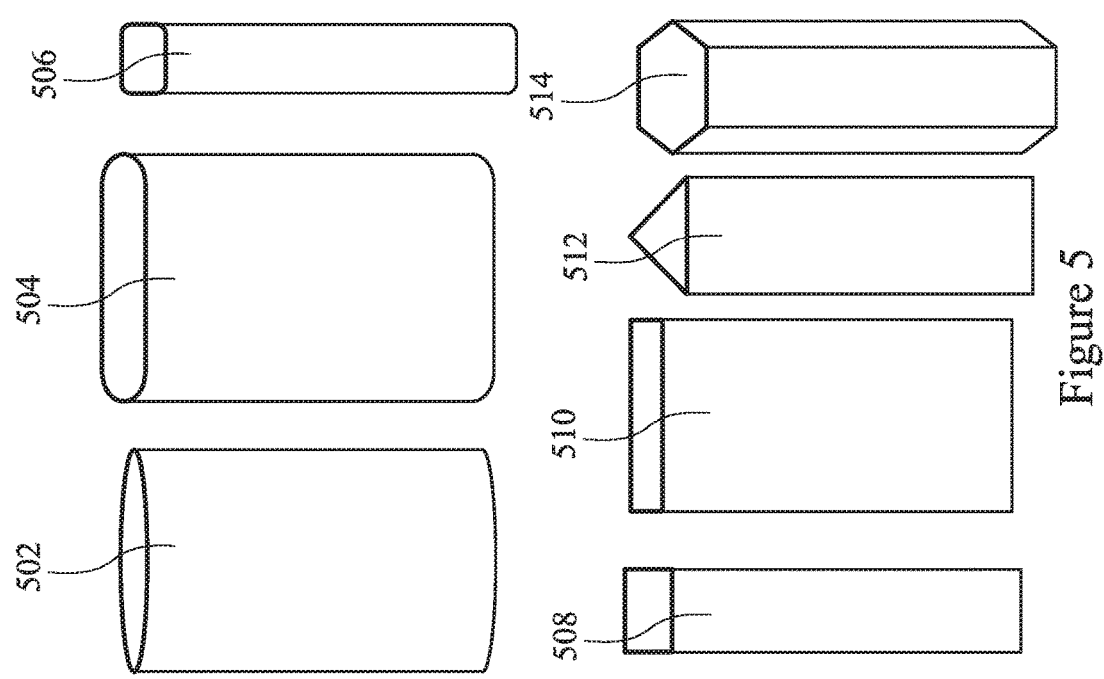
FIG. 5 shows various shapes of a vertical transistor, in accordance with an embodiment.
Figure 6:
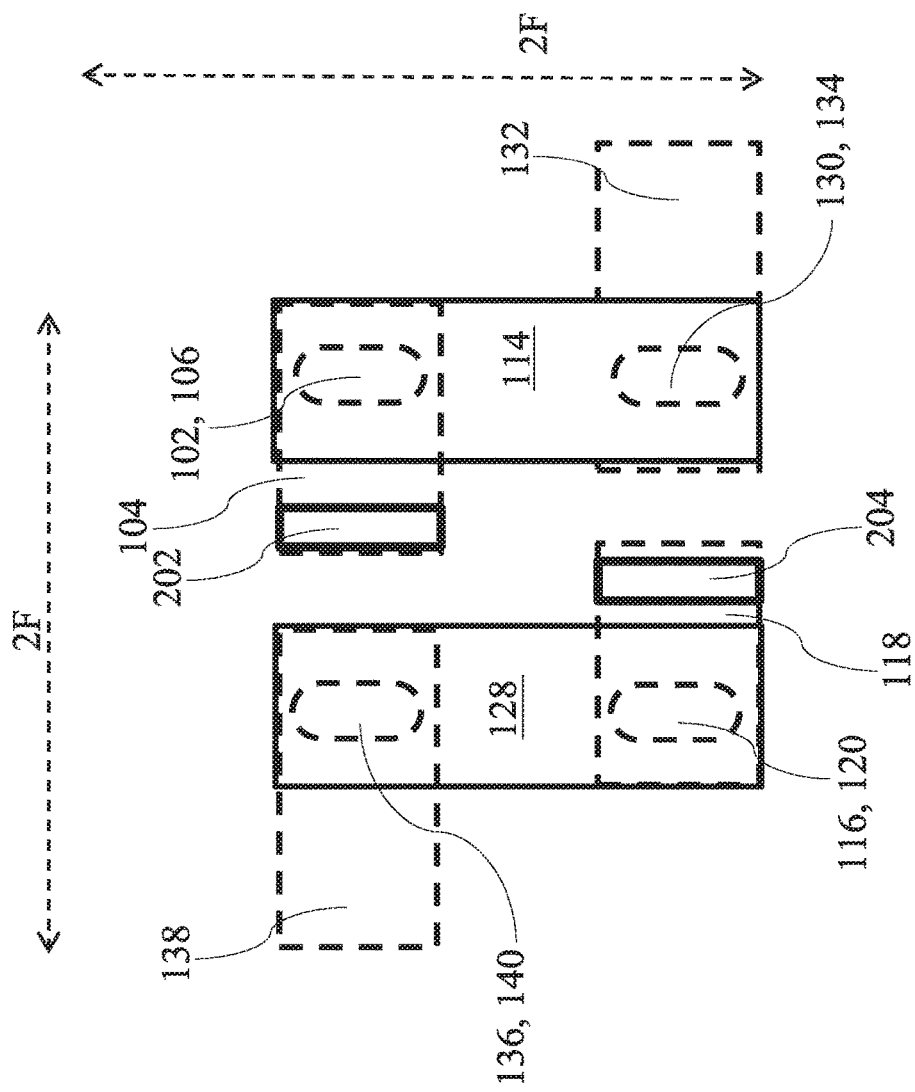
FIGS. 6 and 7 show overlaid top-down views of an SRAM cell having vertical transistors shaped as bars, in accordance with an embodiment.
Figure 7:
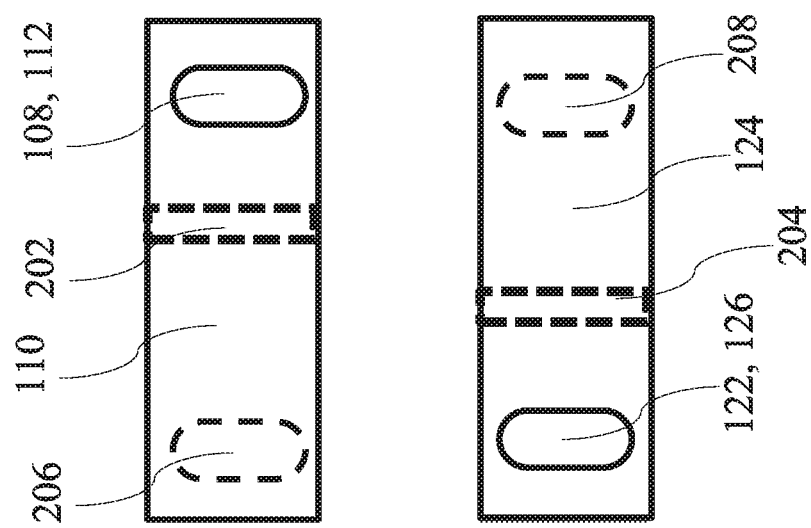

In the examples shown in FIGS. 2 to 4, the vertical transistors PU1, PU2, PD1, PD2, PG1, and PG2 have a circular cross-section. Consequently, in the examples shown in FIGS. 2 to 4, the vertical transistors PU1, PU2, PD1, PD2, PG1, and PG2 may be shaped as wires (e.g. nanowires). However, in other embodiments, the vertical transistors PU1, PU2, PD1, PD2, PG1, and PG2 may have other shapes. FIG. 5 illustrates some of the shapes that the vertical transistors PU1, PU2, PD1, PD2, PG1, and PG2 may have, in accordance with one or more embodiments. As shown in FIG. 5, any of the pull-up transistors PU1 and PU2, pull-down transistors PD1 and PD2, and pass-gate transistors PG1 and PG2 may be shaped as an ellipse 502, a bar 504, a rounded square 506, a square 508, a rectangle 510, a triangle 512, or a hexagon 514. Other shapes may also be possible. As an example, all the transistors of the SRAM cell 100 may be shaped as the par 504. In such an embodiment, the overlaid top-down view of the first active level L1, the first conductive trace 114 and the second conductive trace 128 of the SRAM cell 100 may be as shown in FIG. 6. Similarly, in such an embodiment, the overlaid top-down view of the second active level L2 of the SRAM cell 100 may be as shown in FIG. 7.

FIGS. 8 to 18 show a process flow illustrating some of the steps of a method of manufacturing the SRAM cell 100, in accordance with one or more embodiments. The process flow shown in FIGS. 8 to 18 illustrate an example where the first conductive trace 114 and the second conductive trace 128 comprise a silicide; however other examples where the first conductive trace 114 and the second conductive trace 128 comprise other conductive materials are also contemplated. FIG. 8 shows a semiconductor substrate 802, which may be a semiconductor wafer and may comprise silicon (Si), silicon-on-insulator (SOI); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The semiconductor substrate 802 may be a bulk semiconductor substrate, a semiconductor-on-insulator (SOI) substrate, a multi-layered or gradient semiconductor substrate, or the like. FIG. 8 also shows a first doped region 804 formed over semiconductor substrate 802. The first doped region 804 may be a multi-layer semiconductor substrate comprising a source layer 804a, a channel layer 804b, and a drain layer 804c. In a particular embodiment, at least a portion of the source layer 804a, the channel layer 804b, and the drain layer 804c of the first doped region 804 are utilized to form the source regions, channel regions, and drain regions of the first pull-down transistor PD1, the second pull-down transistor PD2, the first pass-gate transistor PG1, and the second pass-gate transistor PG2. The source layer 804a, the channel layer 804b, and the drain layer 804c of the first doped region 804 may respectively comprise similar materials, dopants, and/or dopant concentrations as the source region 102, channel region, and drain region 106 of the first pull-down transistor PD1.

The first doped region 804 may be formed using an epitaxial growth process that utilizes exposed regions of the semiconductor substrate 802 as a growth initiator. For example, in some embodiments, the epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. In an embodiment, the same epitaxial growth process may be used to form each of the source layer 804a, the channel layer 804b, and the drain layer 804c of the first doped region 804. However, in another embodiment, different epitaxial growth processes may be used to form the source layer 804a, the channel layer 804b, and the drain layer 804c of the first doped region 804.

In an embodiment, the dopants are introduced into the semiconductor material of the source layer 804a, the channel layer 804b, and the drain layer 804c of the first doped region 804 as each layer is grown. As an example, during the epitaxial growth process of the source layer 804a, precursors that comprise the desired dopants are placed in situ into the reaction vessel along with the precursor reactants for the semiconductor material of the source layer 804a. As such, the dopants are introduced and incorporated into the semiconductor material of the source layer 804a to provide the source layer 804a the desired conductivity while the source layer 804a is grown. Although the example presented above is directed to the source layer 804a, a similar process may be used to introduce dopants into the semiconductor material of the channel layer 804b and the drain layer 804c as each layer is grown.

Alternatively, in another embodiment, the dopants may be introduced into the semiconductor material of the source layer 804a, the channel layer 804b, and the drain layer 804c of the first doped region 804 after each layer is grown. As an example, the semiconductor material of the source layer 804a may be grown without the dopants, and an introduction process such as an implantation process or diffusion process is utilized to introduce the dopants into the source layer 804a after growing the source layer 804a, but before growing the channel layer 804b. Once the dopants have been introduced into the source layer 804a, an anneal process may be performed to activate the dopants. Thereafter, the epitaxial growth of the channel layer 804b may be commenced. Although the example presented above is directed to the source layer 804a, a similar process may be used to introduce dopants into the semiconductor material of the channel layer 804b and the drain layer 804c after each layer is grown.

Referring to FIG. 9, a first vertical structure 806 is formed from the first doped region 804, e.g. using a masking and etching process. As an example, a patterned mask (not shown in FIG. 9) may be formed over a portion of the first doped region 804. The patterned mask may be used as a mask as the first doped region 804 is recessed using an appropriate etch process, e.g. anisotropic etch such as reactive ion etching (RIE), to form the first vertical structure 806. The patterned mask may thereafter be removed using, as examples, a stripping process (e.g. a wet strip process) or an ashing process (e.g. plasma ashing process) to yield the arrangement shown in FIG. 9. The first vertical structure 806 can have cross sections in a plane parallel to a top surface of the semiconductor substrate 802 that are circles, squares, rectangles, ovals, ellipses, or the like (e.g. as shown in FIG. 5). In the example of FIG. 9, only one first vertical structure 806 is shown to clearly and simply illustrate various aspects of some embodiments. However, in practice, a plurality of such vertical structures 806 may be formed. As an example, four vertical structures 806 may be formed, and the four vertical structures 806 may be used to manufacture the pull-down transistors PD1, PD2 and the pass-gate transistors PG1, PG2 of the SRAM cell 100 shown in FIGS. 1 and 2.

The first vertical structure 806 comprises a source region 806a, a channel region 806b above the source region 806a, and a drain region 806c above the channel region 806a. As described above, the first vertical structure 806 may be used to manufacture any one of the pull-down transistors PD1, PD2 and the pass-gate transistors PG1, PG2 of the SRAM cell 100 shown in FIGS. 1 and 2. As such, the source region 806a of the first vertical structure 806 may be identified as any one of the source regions 102, 116, 130, and 136 shown in FIG. 2. Similarly, the drain region 806c of the first vertical structure 806 may be identified as any one of the drain regions 106, 120, 134, and 140 shown in FIG. 2. In like manner, the channel region 806b of the first vertical structure 806 may be identified as the channel region of any one of the pull-down transistors PD1, PD2 and the pass-gate transistors PG1, PG2 of the SRAM cell 100 shown in FIG. 2.

Figure 10:
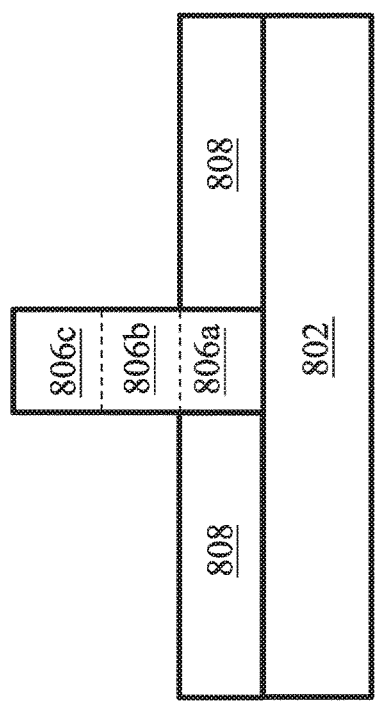

Referring to FIG. 10, a first dielectric layer 808 is formed on the semiconductor substrate 802 and around the source region 806a of the first vertical structure 806. In some embodiments, the first dielectric layer 808 is an oxide formed by a flowable CVD (FCVD) (e.g., a CVD-based material deposition in a remote plasma system) and a post curing, such as an anneal. In other embodiments, the first dielectric layer 808 can be formed by another deposition technique, such as CVD, PECVD, the like, or a combination thereof, and can be a dielectric material such as silicon oxide, phosphosilicate glass (PSG), borosilicate glass (BSG), borophosphosilicate glass (BPSG), un-doped silicate glass (USG), a nitride, oxynitride, or the like.

In some embodiments, the first dielectric layer 808 may cover the sidewalls of the source region 806a, channel region 806b, and drain region 806c as well as a top surface of the first vertical structure 806. In such an embodiment, an etch back process may be performed to remove excess portions of first dielectric layer 808 from the top surface of the first vertical structure 806 and from sidewalls of the drain region 806c and channel region 806b, while leaving the sidewalls of the source region 806a covered by the first dielectric layer 808.

Figure 11:
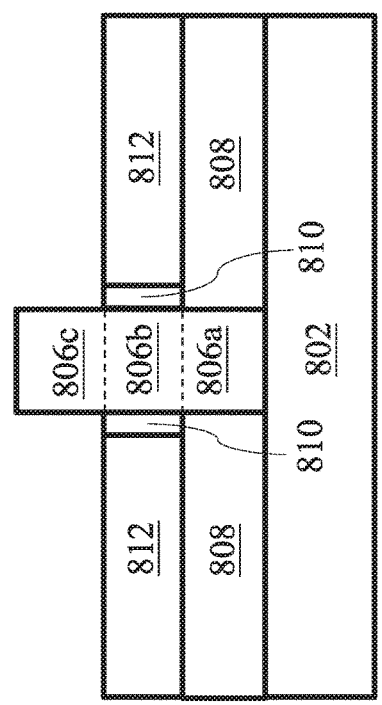

Referring to FIG. 11, a first gate dielectric 810 and a first gate electrode layer 812 are formed. The first gate dielectric 810 is deposited conformally on the vertical channel structures 72, such as over the sidewalls of the channel region 806b of the first vertical structure 806. In accordance with some embodiments, the first gate dielectric 810 comprises silicon oxide, silicon nitride, or multilayers thereof. In other embodiments, the first gate dielectric 810 comprises a high-k dielectric material, and in these embodiments, first gate dielectric 810 may have a k value greater than about 7.0, or further, greater than about 10.0. A high-k dielectric material may include SiON, $Si_3N_4$, $Ta_2O_5$, $Al_2O_3$, a Hf oxide, a Ta oxide, an Al oxide, a rare-earth metal oxide, the like, and a combination thereof. The formation methods of the first gate dielectric 810 may include Molecular Beam Deposition (MBD), ALD, PECVD, the like, or a combination thereof. Next, the first gate electrode layer 812 is deposited over the first gate dielectric 810 and over the first dielectric layer 808, e.g. using one or more of MBD, ALD, PECVD, or the like. The first gate electrode layer 812 may comprise a metal-containing material such as TiN, TaN, TiAl, TaAl, TaC, a Ti-containing material, a Ta-containing material, an Al-containing material, a W-containing material, TiSi, NiSi, PtSi, polysilicon with a silicide, a Cu-containing material, a refractory material, the like, combinations thereof, or multi-layers thereof. The first gate electrode layer 812 may, as an example, be identified as any one of the gates 104, 118, 132, and 138 shown in FIG. 2.

Referring to FIG. 12, a second dielectric layer 814 is formed on the first gate dielectric 810 and the first gate electrode layer 812. The second dielectric layer 814 is also formed around the drain region 806c of the first vertical structure 806. The second dielectric layer 814 may comprise similar materials as the first dielectric layer 808. The second dielectric layer 814 may be formed using similar processes as the first dielectric layer 808. With the formation of the second dielectric layer 814, at least a portion of the first active level L1 of the SRAM cell 100 may be formed.

Referring to FIG. 13, a silicide layer 816 may be formed (e.g. using one or more of MBD, ALD, PECVD, or the like) over the drain region 806c of the first vertical structure 806 as well as over the second dielectric layer 814. The silicide layer 816 may be identified as the first conductive trace 114 or the second conductive trace 128 shown in FIG. 2. The silicide layer 816 may be formed by a blanket deposition of one or more appropriate metal layers, followed by an annealing step, such as a rapid thermal anneal (RTA), in which the metal or metals react with the underlying exposed semiconductor material (e.g. silicon). Unreacted metal may then be removed, for example, with a selective etch process.

Figure 14:
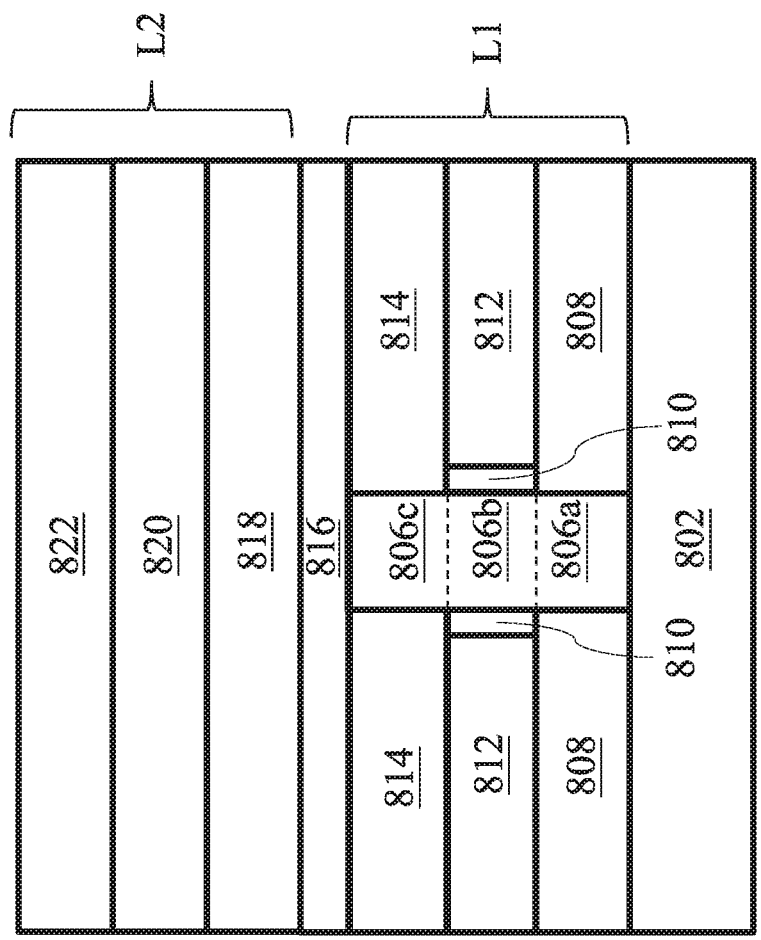

Referring to FIG. 14, the process flow continues with the formation of a third dielectric layer 818 over the silicide layer 816, the formation of a second gate electrode layer 820 over the third dielectric layer 818, and the formation of a fourth dielectric layer 822 over the second gate electrode layer 820. The third dielectric layer 818 and the fourth dielectric layer 822 may comprise similar materials as the first dielectric layer 808. Furthermore, the third dielectric layer 818 and the fourth dielectric layer 822 may be formed using similar processes as the first dielectric layer 808. The second gate electrode layer 820 may comprise similar materials as the first gate electrode layer 812. Furthermore, the second gate electrode layer 820 may be formed using similar processes as the first gate electrode layer 820. The third dielectric layer 818, the second gate electrode layer 820, and the fourth dielectric layer 822 may define the second active level L2 of the SRAM cell 100. Additionally, the second gate electrode layer 820 may be used to form the gates 110 and/or 124 (shown in FIG. 2) of the first pull-up transistor PU1 and the second pull-up transistor PU2, respectively.

Figure 15:
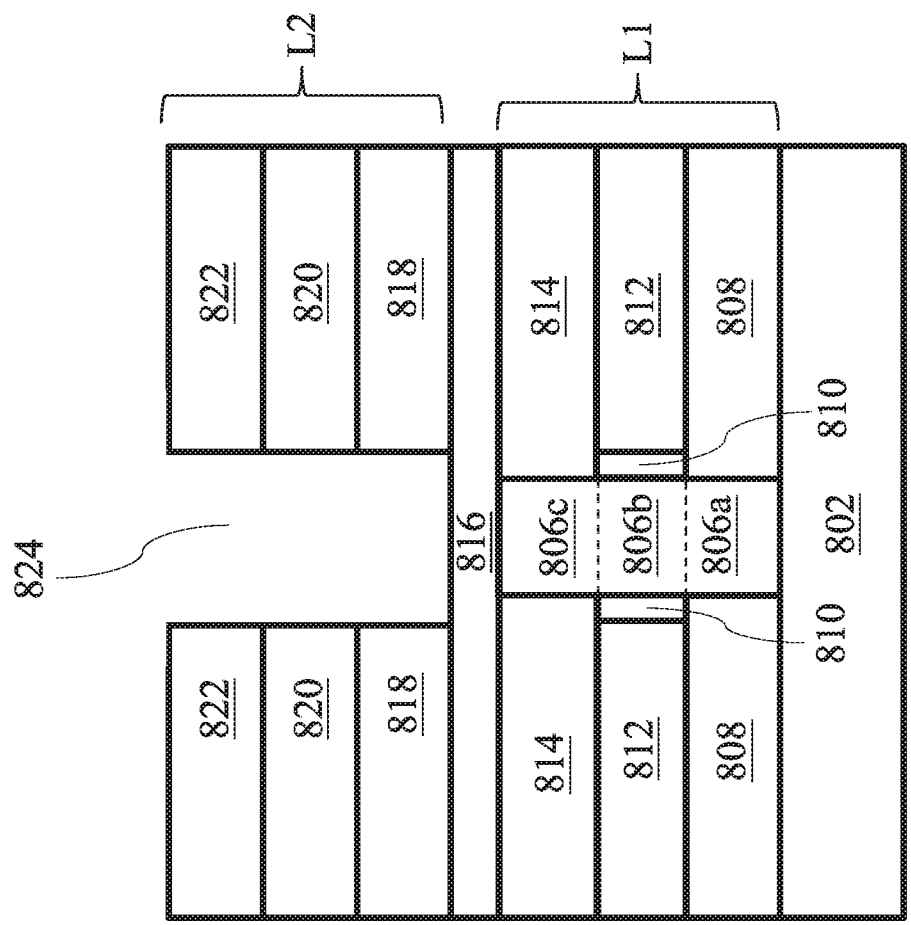
Figure 16:
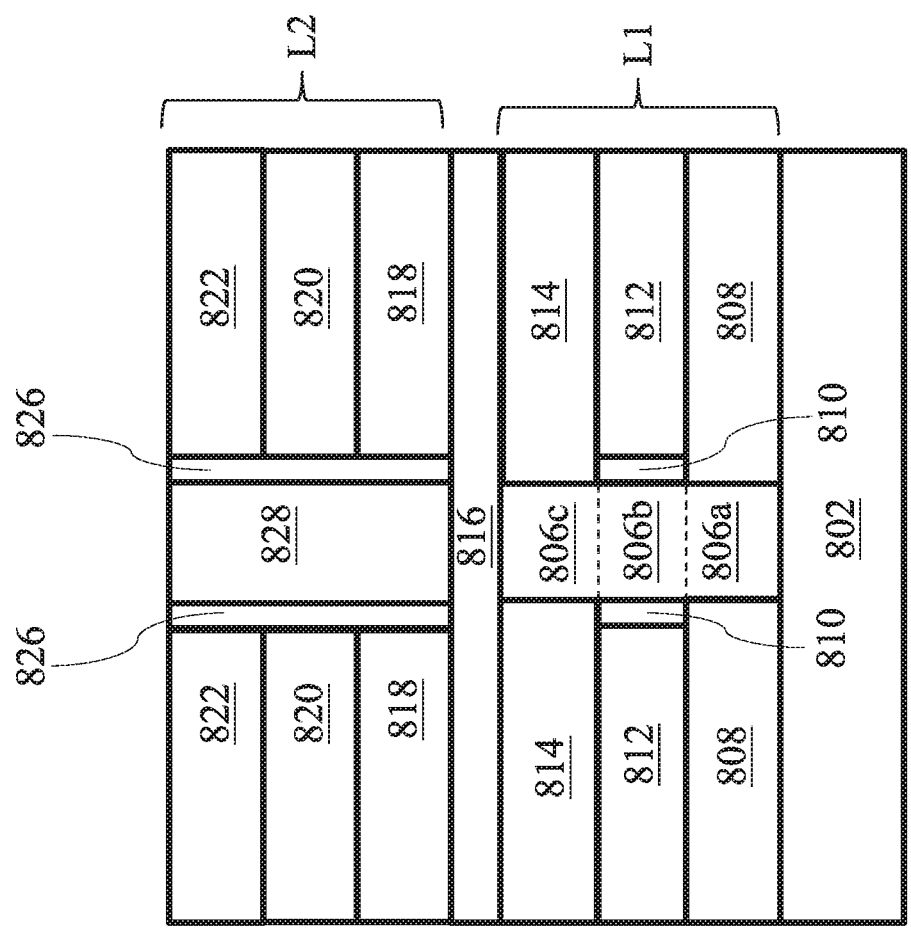

Referring to FIG. 15, an opening 824 may be formed in the third dielectric layer 818, the second gate electrode layer 820, and the fourth dielectric layer 822 to expose a portion of the silicide layer 816. The opening 824 may be formed by a lithographic and etching process that uses a patterned mask having openings formed therein. In some embodiments, the openings in the patterned mask are substantially aligned with the first vertical structure 806. The opening 824 may be formed using a suitable etch process (e.g. anisotropic etch such as RIE or the like). Following the formation of the opening 824, the process flow may depend on whether the first vertical structure 806 is one of the pull-down transistors PD1, PD2 or one of the pass-gate transistors PG1, PG2. In the embodiment where the first vertical structure 806 is one of the pull-down transistors PD1, PD2, the opening 824 in the second active layer L2 may be used to form the first pull-up transistor PU1 or the second pull-up transistor PU2 over the first pull-down transistor PD1 or the second pull-down transistor PD2, respectively. Such a step is shown in FIG. 16, where a second gate dielectric 826 is formed (e.g. conformally formed) on sidewalls of the opening 824.

The second gate dielectric 826 may comprise similar materials as the first gate dielectric 810 and may be formed using similar processes as the first gate dielectric 810. In addition, a second vertical structure 828 may be formed to fill the opening 824. The second vertical structure 828 may comprise a polycrystalline semiconductor material such as silicon, germanium, silicon germanium, combinations of these, or the like. Consequently, the second vertical structure 828 may be identified with the first pull-up transistor PU1 and/or the second pull-up transistor PU2 shown in FIG. 2. The portion of the second vertical structure 828 surrounded by the third dielectric layer 818 may be identified with any one of the drain regions 112 and 126 shown in FIG. 2. The portion of the second vertical structure 828 surrounded by the second gate electrode layer 820 may be identified with any one of the channel regions of the first pull-up transistor PU1 or the second pull-up transistor PU2. Furthermore, the portion of the second vertical structure 828 surrounded by the fourth dielectric layer 822 may be identified with any one of the source regions 108 and 122 shown in FIG. 2.

The second vertical structure 828 may be formed using an epitaxial growth process that utilizes exposed regions of the silicide layer 816 as a growth initiator. For example, in some embodiments, the epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. In some embodiments, the second vertical structure 828 may overfill the opening 824. In such an embodiment, a planarizing step (e.g. a chemical mechanical polishing step) may be performed to remove portions of the second vertical structure 828 outside the opening 824.

In an embodiment, the dopants are introduced into the material of the second vertical structure 828 as the second vertical structure 828 is grown. As an example, during the epitaxial growth process of the second vertical structure 828, precursors that comprise the desired dopants are placed in situ into the reaction vessel along with the precursor reactants for the material of the second vertical structure 828. As such, the dopants are introduced and incorporated into the material of the second vertical structure 828 to provide the second vertical structure 828 the desired conductivity (e.g. p-type) while the second vertical structure 828 is grown. Alternatively, in another embodiment, the dopants may be introduced into the material of the second vertical structure 828 after the second vertical structure 828 is grown. As an example, the material of the second vertical structure 828 may be grown without the dopants, and an introduction process such as an implantation process or diffusion process is utilized to introduce the dopants into the material of the second vertical structure 828.

Figure 17:
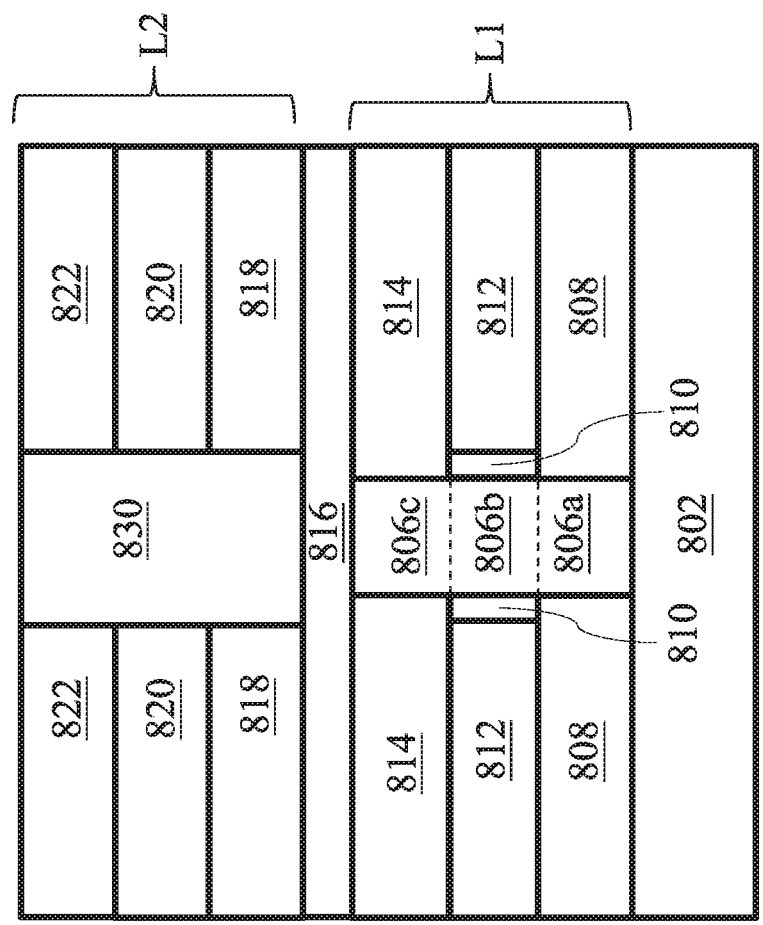
Figure 18:
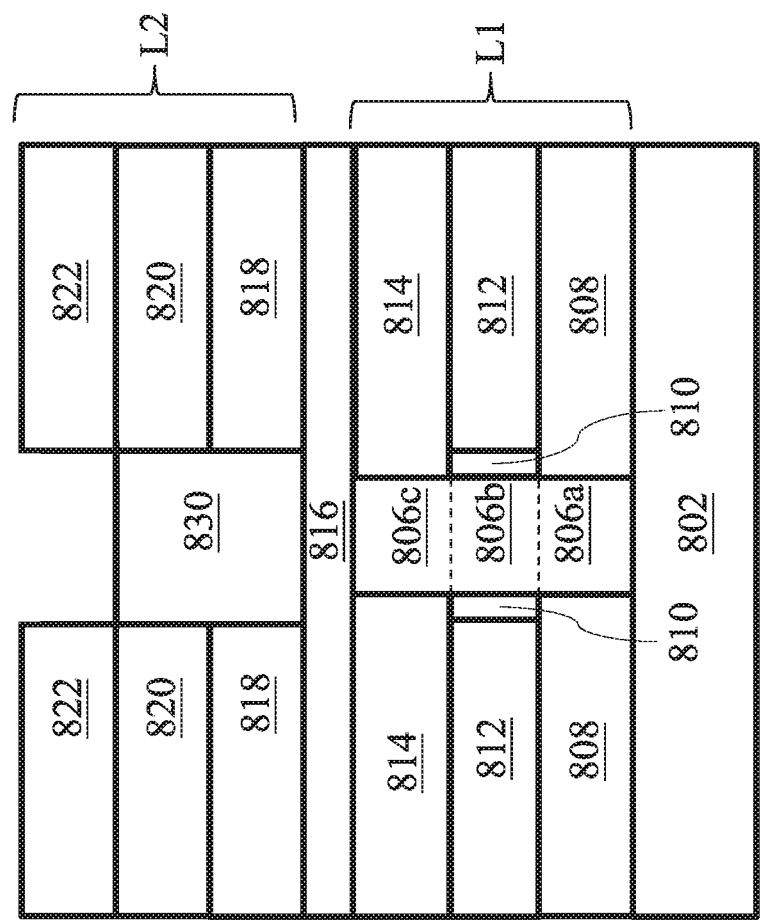

Referring back to FIG. 15, following the formation of the opening 824, the process flow may depend on whether the first vertical structure 806 is one of the pull-down transistors PD1, PD2 or one of the pass-gate transistors PG1, PG2. In the embodiment where the first vertical structure 806 is one of the pass-gate transistors PG1, PG2, the opening 824 in the second active layer L2 may be used to form the third via 206 or the fourth via 208 over the second pass-gate transistor PG2 or the first pass-gate transistor PG1, respectively. Such a step is shown in FIG. 17, where a metal feature 830 may be formed to fill the opening 824. The metal feature 830 may comprise similar materials as the first gate electrode layer 812 and may be formed using similar processes as the first gate electrode layer 812. Subsequently, in some embodiments, the metal feature 830 may be etched back (e.g. using a suitable etching process such as RIE), as shown in FIG. 18, e.g. such that a top surface of the metal feature 830 is substantially coplanar with a top surface of the second gate electrode layer 820. Following this, the top surface of the metal feature 830 may be covered by dielectric material (not shown in FIG. 18).

In the example shown above, when a first one of the first vertical structure 806 is one of the pass-gate transistors PG1, PG2 and a second one of the first vertical structure 806 is one of the pull-down transistors PD1, PD2, the metal feature 830 is formed in the opening 824 over the pass-gate transistor PG1 or PG2, while the second vertical structure 828 and the second gate dielectric 826 are formed in the opening 824 over the pull-down transistor PD1 or PD2. However, in another embodiment, the second vertical structure 828 and the second gate dielectric 826 may be formed in the opening 824 over the pass-gate transistor PG1 or PG2 as well as in the opening 824 over the pull-down transistor PD1 or PD2. Subsequently, the second vertical structure 828 and the second gate dielectric 826 over the pass-gate transistor PG1 or PG2 may be removed (e.g. through an etching process) to expose a portion of the silicide layer 816, thereby reforming the opening 824. The opening 824 over the pass-gate transistor PG1 or PG2 may then be filled with a conductive material to form the metal feature 830, e.g. as shown in FIGS. 17 and 18. Consequently, in such an embodiment, the p-channels over the pass-gate transistors PG1, PG2 may be transformed into local drain-to-gate contacts by removing the second vertical structure 828 (e.g. poly-Ge) and the second gate dielectric 826 and filling the opening with metal.

The process flow shown in FIGS. 8 to 18 show an example of a method of manufacturing the pull-up transistors PU1 and PU2, pull-down transistors PD1 and PD2, and pass-gate transistors PG1 and PG2 of the SRAM cell 100 shown in FIG. 2. As described above in respect of FIG. 15, the opening 824 may be formed by using a patterned mask as an etching mask. The alignment of the opening 824 with the underlying first vertical structure 806 depends on the alignment of the patterned mask with the first vertical structure 806. Consequently, the metal feature 830 and the second vertical structure 828 formed in the opening 824 is not self-aligned with the first vertical structure 806.

Figure 19:
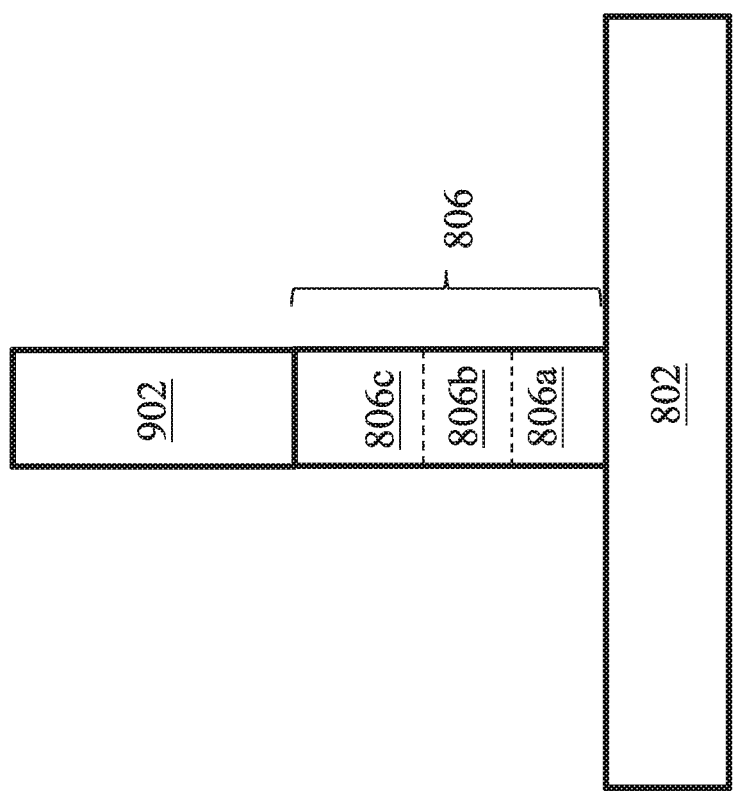
FIGS. 19 to 30 show a process flow illustrating some of the steps of a method of manufacturing an SRAM cell where vertical transistors are self-aligned, in accordance with an embodiment.

FIGS. 19 to 30 show a process flow illustrating some of the steps of a method of manufacturing an SRAM cell where vertical transistors are self-aligned, in accordance with one or more embodiments. The process flow shown in FIGS. 19 to 30 illustrate an example where the first conductive trace 114 and the second conductive trace 128 comprise a silicide; however other examples where the first conductive trace 114 and the second conductive trace 128 comprise other conductive materials are also contemplated. Referring to FIG. 19, the first vertical structure 806 may be formed over the semiconductor substrate 802 (e.g. using the processes described above in respect of FIGS. 8 and 9). In addition, a sacrificial vertical structure 902 is formed over the first vertical structure 806. The sacrificial vertical structure 902 may comprise a semiconductor material similar to the first vertical structure 806. The sacrificial vertical structure 902 may be formed using an epitaxial growth process that utilizes exposed regions of the drain region 806c of the first vertical structure 806 as a growth initiator. For example, in some embodiments, the epitaxial growth process may be molecular beam epitaxy (MBE), liquid phase epitaxy (LPE), vapor phase epitaxy (VPE), selective epitaxial growth (SEG), or combinations thereof. Other epitaxial growth processes may also be possible. Since the sacrificial vertical structure 902 is formed by using exposed regions of the drain region 806c of the first vertical structure 806 as a growth initiator, the sacrificial vertical structure 902 may have substantially equal lateral dimensions as the first vertical structure 806.

Figure 20:
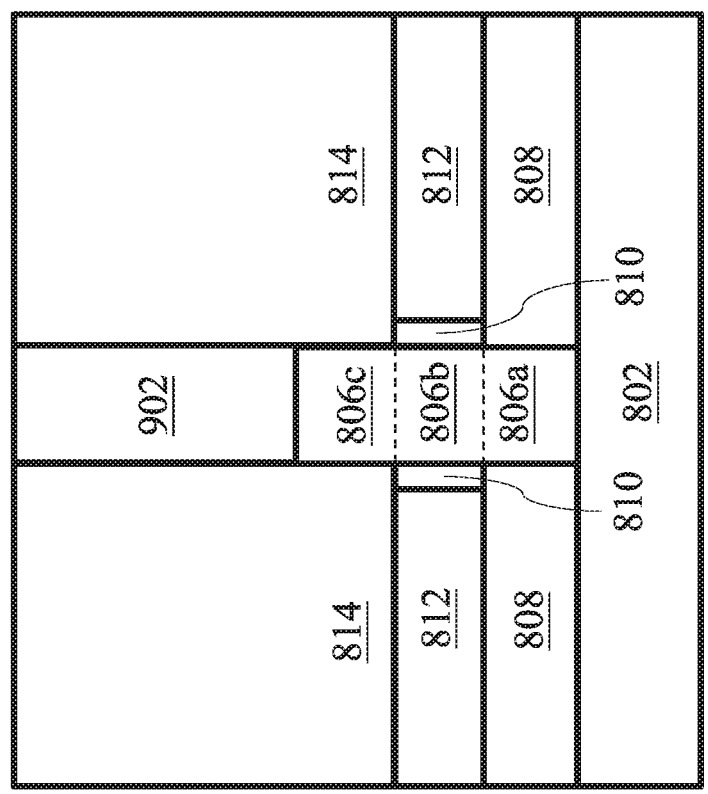

Referring to FIG. 20, the first dielectric layer 808, the first gate dielectric 810, the first gate electrode layer 812, and the second dielectric layer 814 may be formed around the first vertical structure 806 and the sacrificial vertical structure 902. In this example, the first dielectric layer 808 may be formed around the source region 806a of the first vertical structure 806, while the first gate dielectric 810 and the first gate electrode layer 812 may be formed around the channel region 806b of the first vertical structure 806. The second dielectric layer 814 may be formed around the drain region 806c of the first vertical structure 806 and also around the sacrificial vertical structure 902. Similar processes described above in respect of FIGS. 10 to 12 may be used in forming the first dielectric layer 808, the first gate dielectric 810, the first gate electrode layer 812, and the second dielectric layer 814 around the first vertical structure 806 and the sacrificial vertical structure 902.

Figure 21:
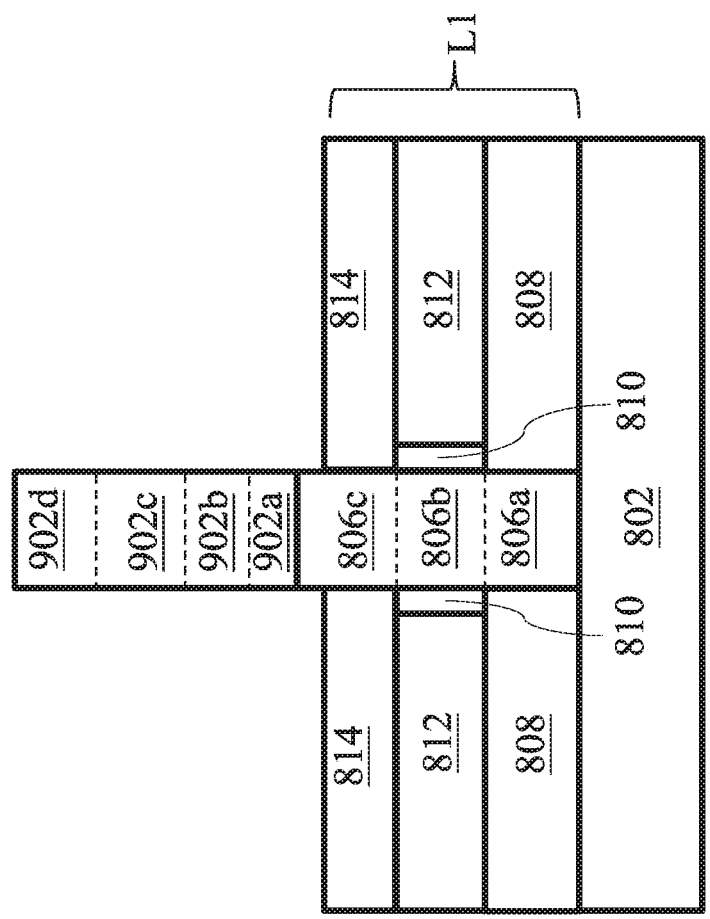
Figure 22:
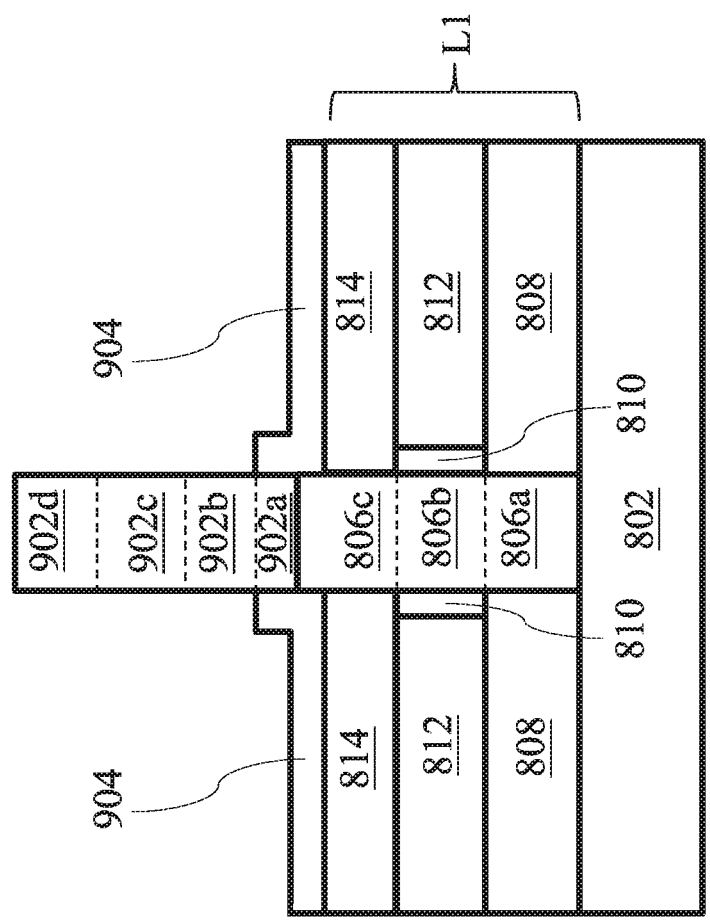

Referring to FIG. 21, a portion of the second dielectric layer 814 may be recessed (e.g. using a suitable etching process such as RIE) to expose the sacrificial vertical structure 902 and a portion of the drain region 806c proximal the sacrificial vertical structure 902. Following this, as shown in FIG. 22, a silicide layer 904 may be formed over the remaining portion of the second dielectric layer 814 and around the exposed portion of the drain region 806c, e.g. using the processes described above in respect of the silicide layer 816. Additionally, the silicide layer 904 may surround a first portion 902a of the sacrificial vertical structure 902 proximal the drain region 806c. The sacrificial vertical structure 902 may additionally include a second portion 902b over the first portion 902a, a third portion 902c over the second portion 902b, and a fourth portion 902d over the third portion 902c.

In some embodiments, the silicide layer 904 may be formed over a top surface of the fourth portion 902d of the sacrificial vertical structure 902 and around sidewalls of the first portion 902a, the second portion 902b, the third portion 902c, and the fourth portion 902d of the sacrificial vertical structure 902. Thereafter, a portion of the silicide layer 904 may be planarized and/or etched to expose the top surface of the fourth portion 902d of the sacrificial vertical structure 902 and the sidewalls of the second portion 902b, the third portion 902c, and the fourth portion 902d of the sacrificial vertical structure 902 to yield the structure shown in FIG. 22. With the formation of the silicide layer 904, the first active level L1 of the SRAM cell 100 is defined, and the silicide layer 904 may be processed in subsequent steps to form the first conductive trace 114 or the second conductive trace 128 shown in FIG. 2.

Figure 23:
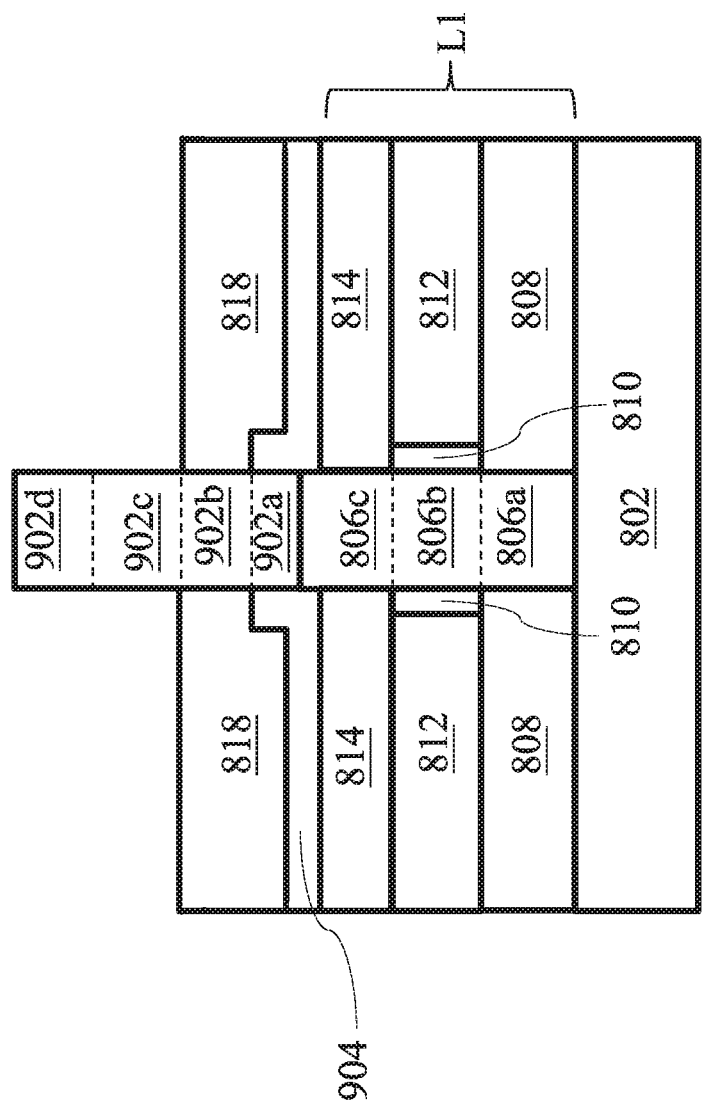

Referring to FIG. 23, the third dielectric layer 818 may be formed over the silicide layer 904 and around the second portion of the sacrificial vertical structure 902, e.g. using one or more of the processes described above in relation to FIG. 14. In some embodiments, the third dielectric layer 818 may be formed over a top surface of the fourth portion 902d of the sacrificial vertical structure 902 and around sidewalls of the second portion 902b, the third portion 902c, and the fourth portion 902d of the sacrificial vertical structure 902. Thereafter, a portion of the third dielectric layer 818 may be planarized and/or etched to expose the top surface of the fourth portion 902d of the sacrificial vertical structure 902 and the sidewalls of the third portion 902c and the fourth portion 902d of the sacrificial vertical structure 902 to yield the structure shown in FIG. 23.

Figure 24:
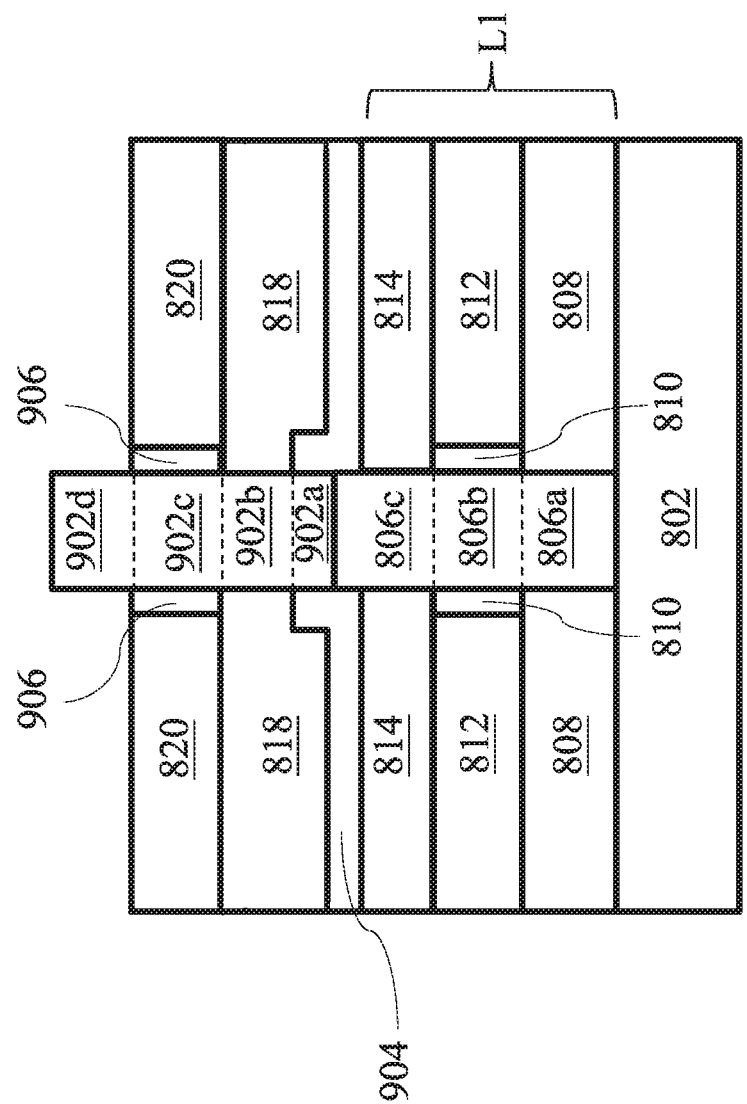

Referring to FIG. 24, the process flow continues with the formation of a dummy gate dielectric 906 over the third dielectric layer 818 and around the third portion 902c of the sacrificial vertical structure 902. In addition, the second gate electrode layer 820 is formed over the third dielectric layer 818 and around the dummy gate dielectric 906. The dummy gate dielectric 906 may comprise similar materials as the first gate dielectric 810 and may be formed using similar processes as the first gate dielectric 810. In some embodiments, the dummy gate dielectric 906 and the second gate electrode layer 820 may be formed over a top surface of the fourth portion 902d of the sacrificial vertical structure 902 and around sidewalls of the third portion 902c and fourth portion 902d of the sacrificial vertical structure 902. Thereafter, a portion of the dummy gate dielectric 906 and the second gate electrode layer 820 may be planarized and/or etched to expose the top surface of the fourth portion 902d of the sacrificial vertical structure 902 and the sidewalls of the fourth portion 902d of the sacrificial vertical structure 902 to yield the structure shown in FIG. 24.

Figure 25:
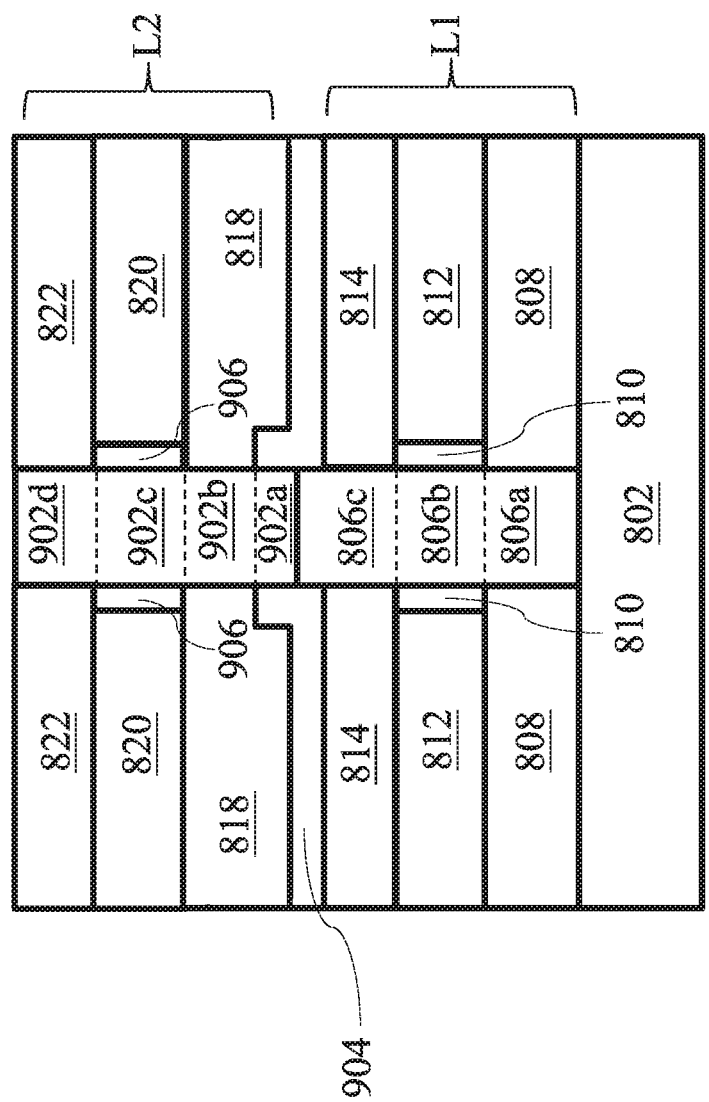

Referring to FIG. 25, the process flow continues with the formation of the fourth dielectric layer 822 over the dummy gate dielectric 906 and the second gate electrode layer 820. The fourth dielectric layer 822 is also formed around the fourth portion 902d of the sacrificial vertical structure 902. In some embodiments, the fourth dielectric layer 822 may be formed over a top surface and around sidewalls of the fourth portion 902d of the sacrificial vertical structure 902. Thereafter, a portion of the fourth dielectric layer 822 may be planarized and/or etched to expose the top surface of the fourth portion 902d of the sacrificial vertical structure 902 to yield the structure shown in FIG. 25. In the embodiment of FIG. 25, the top surfaces of the fourth portion 902d of the sacrificial vertical structure 902 and the fourth dielectric layer 822 are substantially co-planar. Furthermore, the third dielectric layer 818, the second gate electrode layer 820, and the fourth dielectric layer 822 may define the second active level L2 of the SRAM cell 100.

Figure 26:
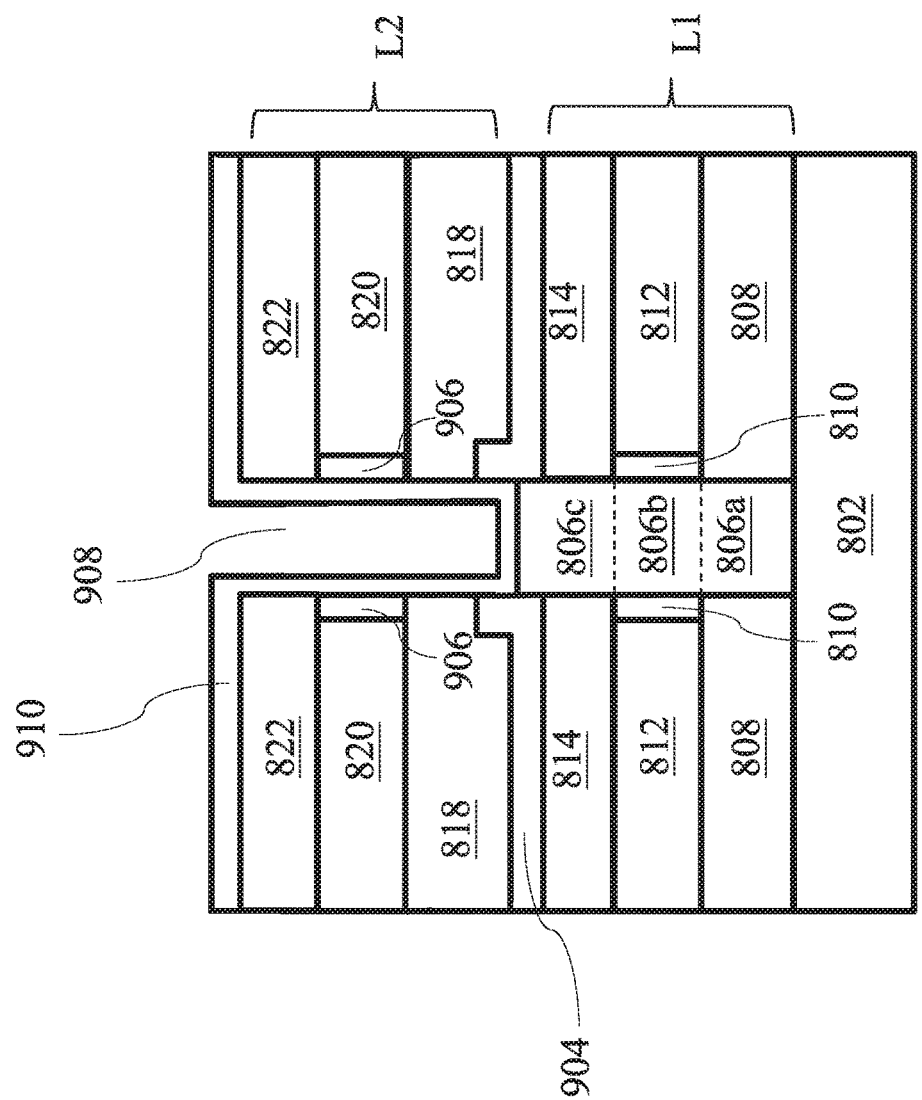
Figure 27:
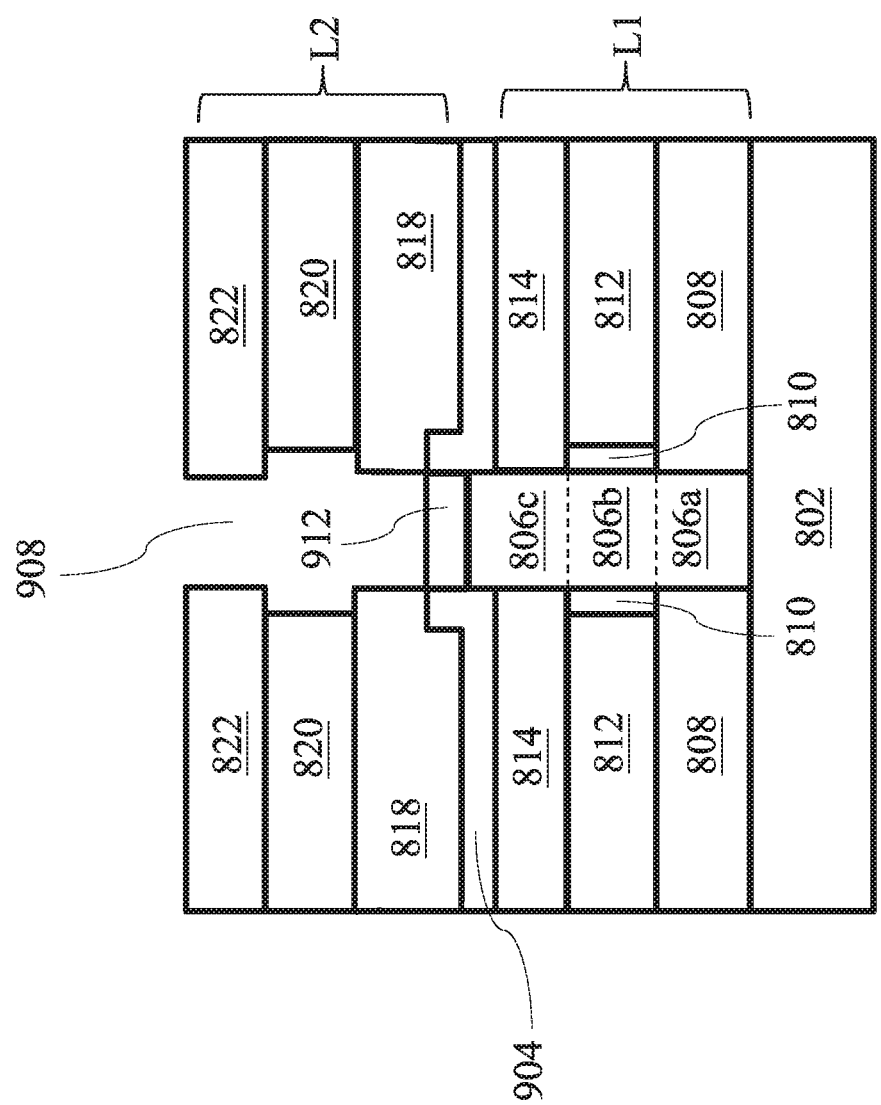

The process flow continues with the step shown in FIG. 26, where the sacrificial vertical structure 902 is removed (e.g. using a suitable etching process) to expose the top surface of the first vertical structure 806, thereby forming an opening 908. A metal layer 910 is also formed (e.g. conformally formed) on sidewalls of the opening 908 and over the top surface of the fourth dielectric layer 822. The metal layer 910 may be formed using one or more of MBD, ALD, PECVD, or the like and may comprise a suitable metal that may be converted to a silicide (e.g. cobalt, titanium, nickel, palladium, platinum, erbium, combinations of these, and the like). Following the formation of the metal layer 910, a silicidation process may be performed where the metal layer 910 is subjected to an annealing step, such as a rapid thermal anneal (RTA), in which the metal or metals react with the underlying exposed semiconductor material (e.g. silicon of the drain region 806c of the first vertical structure 806. Unreacted metal may then be removed, for example, with a selective etch process to yield the silicide region 912 disposed at a bottom of the opening 908 and over the drain region 806c of the first vertical structure 806, as shown in FIG. 27. The selective etch process may additionally remove the dummy gate dielectric 906, thereby exposing sidewalls of the second gate electrode layer 820, as shown in FIG. 27. The silicide layer 904 together with the silicide region 912 may be identified with the first conductive trace 114 or the second conductive trace 128 shown in FIG. 2.

Figure 28:
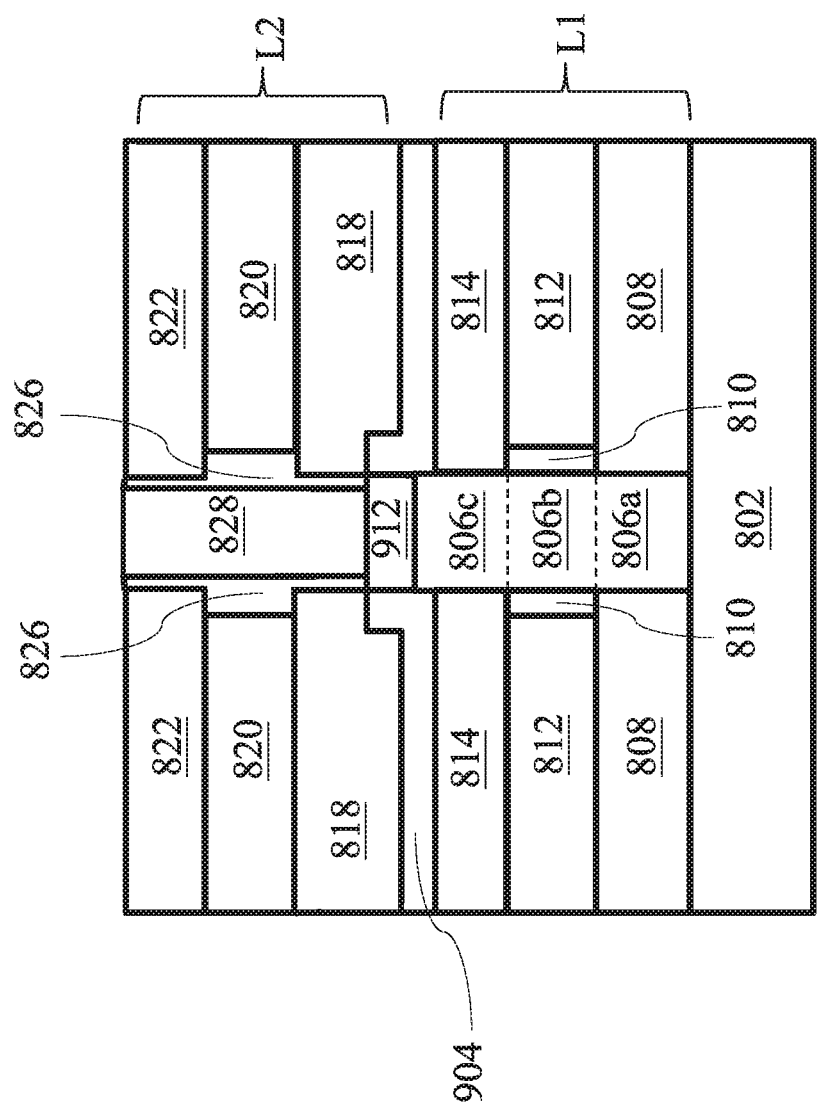

Following the formation of the silicide region 912 at the bottom of the opening 908, the process flow may depend on whether the first vertical structure 806 is one of the pull-down transistors PD1, PD2 or one of the pass-gate transistors PG1, PG2. In the embodiment where the first vertical structure 806 is one of the pull-down transistors PD1, PD2, the opening 908 in the second active layer L2 may be used to form the first pull-up transistor PU1 or the second pull-up transistor PU2 over the first pull-down transistor PD1 or the second pull-down transistor PD2, respectively. Such a step is shown in FIG. 28 where the second gate dielectric 826 is formed (e.g. conformally formed) on sidewalls of the opening 908 using one or more of the processes described above in respect of FIG. 16. In addition, the second vertical structure 828 may be formed to fill the opening 908, e.g. using one or more of the processes described above in respect of FIG. 16. The second vertical structure 828 may be identified with the first pull-up transistor PU1 or the second pull-up transistor PU2 shown in FIG. 2. In some embodiments, the formation of the second vertical structure 828 may be followed by an annealing step, which may cause semiconductor material from the second vertical structure 828 to react or diffuse into the silicide region 912.

Figure 29:
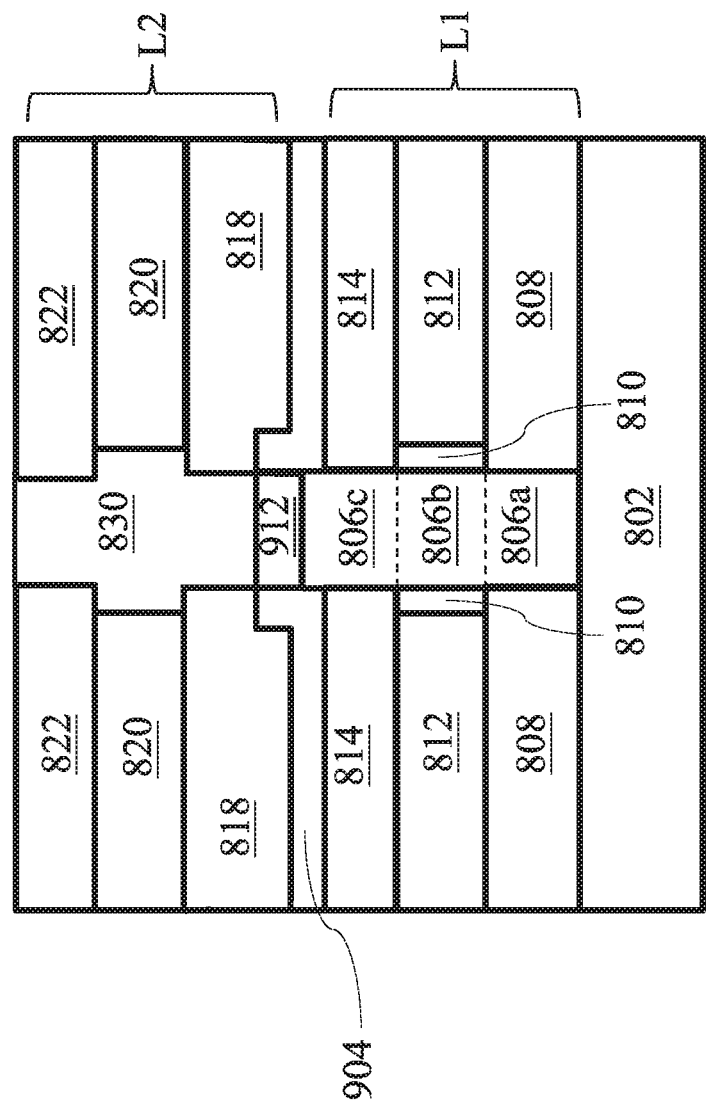
Figure 30:
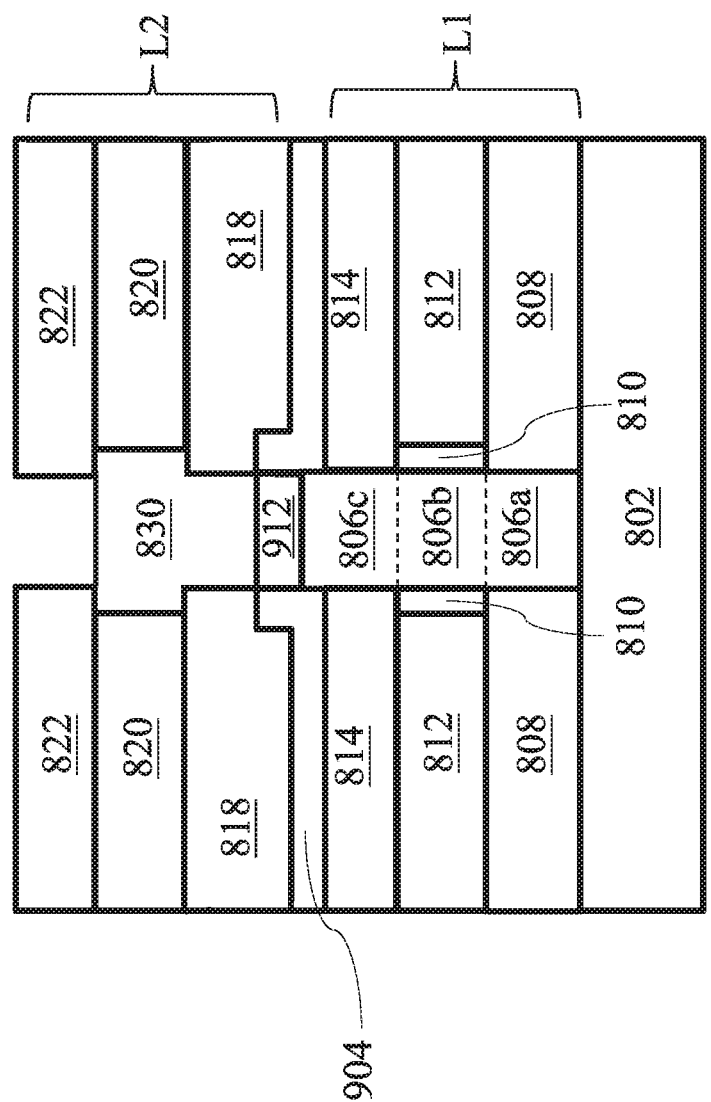

Referring back to FIG. 27, following the formation of the silicide region 912 at the bottom of the opening 908, the process flow may depend on whether the first vertical structure 806 is one of the pull-down transistors PD1, PD2 or one of the pass-gate transistors PG1, PG2. In the embodiment where the first vertical structure 806 is one of the pass-gate transistors PG1, PG2, the opening 908 in the second active layer L2 may be used to form the third via 206 or the fourth via 208 over the second pass-gate transistor PG2 or the first pass-gate transistor PG1, respectively. Such a step is shown in FIG. 29, where the metal feature 830 may be formed to fill the opening 824. The metal feature 830 may comprise similar materials as the first gate electrode layer 812 and may be formed using similar processes as the first gate electrode layer 812. Subsequently, in some embodiments, the metal feature 830 may be etched back (e.g. using a suitable etching process such as RIE), as shown in FIG. 30, e.g. such that a top surface of the metal feature 830 is substantially coplanar with a top surface of the second gate electrode layer 820. Following this, the top surface of the metal feature 830 may be covered by dielectric material (not shown in FIG. 30).

In the example shown above, when a first one of the first vertical structure 806 is one of the pass-gate transistors PG1, PG2 and a second one of the first vertical structure 806 is one of the pull-down transistors PD1, PD2, the metal feature 830 is formed in the opening 908 over the pass-gate transistor PG1 or PG2, while the second vertical structure 828 and the second gate dielectric 826 are formed in the opening 908 over the pull-down transistor PD1 or PD2. However, in another embodiment, the second vertical structure 828 and the second gate dielectric 826 may be formed in the opening 908 over the pass-gate transistor PG1 or PG2 as well as in the opening 908 over the pull-down transistor PD1 or PD2. Subsequently, the second vertical structure 828 and the second gate dielectric 826 over the pass-gate transistor PG1 or PG2 may be removed (e.g. through an etching process) to expose the silicide region 912, thereby reforming the opening 908. The opening 908 over the pass-gate transistor PG1 or PG2 may then be filled with a conductive material to form the metal feature 830, e.g. as shown in FIGS. 29 and 30.

The process flow shown in FIGS. 19 to 30 show an example of a method of manufacturing the pull-up transistors PU1 and PU2, pull-down transistors PD1 and PD2, and pass-gate transistors PG1 and PG2 of the SRAM cell 100 shown in FIG. 2. As described above in respect of FIG. 19, the sacrificial vertical structure 902 may be formed over first vertical structure 806 prior to the formation of the dielectric layers 808, 814, 818, 822, the gate electrode layers 812, 820, and the gate dielectrics 810, 906. Furthermore, the sacrificial vertical structure 902 defines the location of the opening 908 that is subsequently formed in the second active level of the SRAM cell 100. Consequently, the metal feature 830 and the second vertical structure 828 are self-aligned with the first vertical structure 806.

Figure 31:
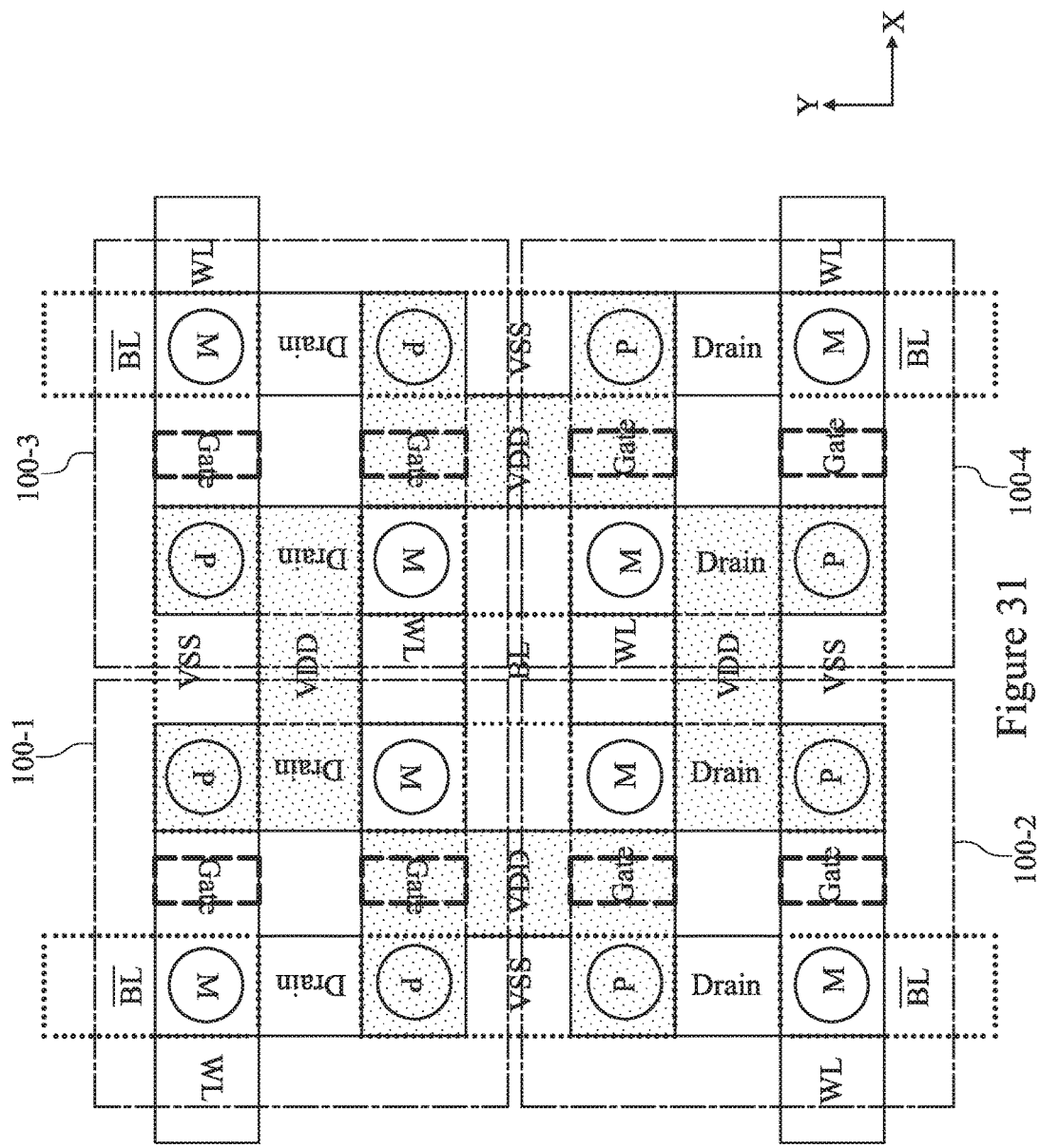
FIG. 31 shows an overlaid top-down view of a 2×2 array of SRAM cells, in accordance with an embodiment.

FIG. 31 shows an overlaid top-down view of a 2×2 array of SRAM cells 100, in accordance with one or more embodiments. Larger arrays are contemplated, and the 2×2 array is depicted to clearly and simply illustrate various aspects of some embodiments. The array shown in FIG. 31 illustrates an example where the first conductive trace 114 and the second conductive trace 128 comprise a silicide; however other examples where the first conductive trace 114 and the second conductive trace 128 comprise other conductive materials are also contemplated. In the array, each SRAM cell 100 has an adjacent cell 100 that is mirrored across the X- or Y-direction boundary where the cells 100 adjoin. For example, cell 100-2 is a mirrored version of cell 100-1 along an X-direction boundary between the cells 100-1 and 100-2. Similarly, cell 100-3 is a mirrored version of cell 100-1 along a Y-direction boundary between the cells 100-1 and 100-3. The 2×2 array shown in FIG. 31 illustrates circular nanowire transistors (e.g. when viewed in a cross-section). However the shape of the cross-section of the transistors may be any other shape, e.g. bar, rectangular, elliptical (as shown in FIG. 5). Each of the SRAM cells 100 may have the three-dimensional (3D) layout shown in FIG. 2, where vertical transistors are formed in the first active level L1 and the second active level L2 in an effort to reduce the footprint of the SRAM cell 100 and, consequently, increase the integration density of a plurality of such SRAM cells 100 (such as the 2×2 array shown in FIG. 31).

Figure 32:
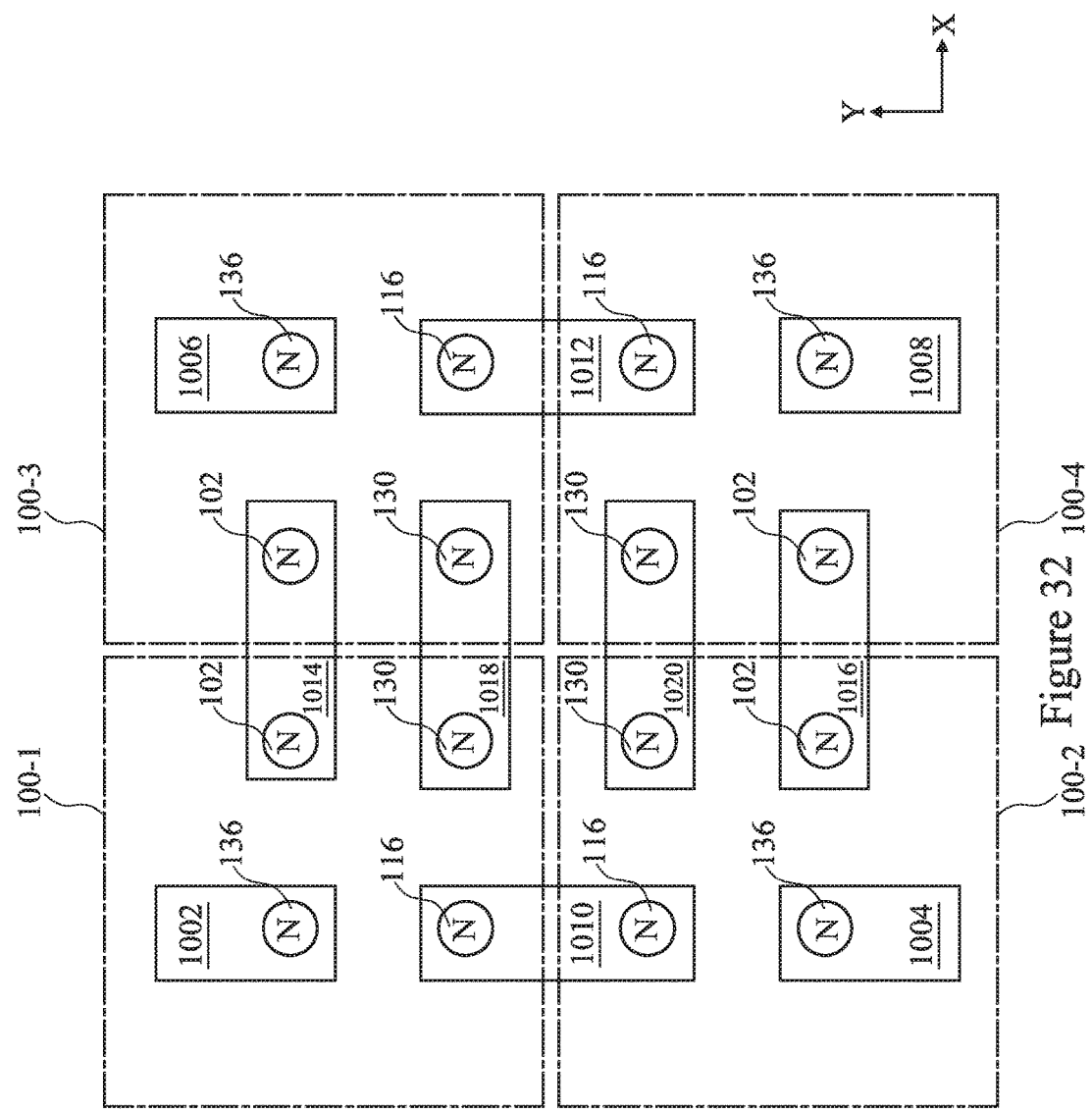
FIGS. 32-35 show an overlaid top-down view of a source-level of a first active level of the 2×2 array of SRAM cells shown in FIG. 31, in accordance with an embodiment.

In the description that follows, various aspects of the different levels of the vertically stacked transistors of the array of SRAM cells 100 shown in FIG. 31 are described. FIG. 32 shows an overlaid top-down view of a source-level S1 of the first active level L1 of the 2×2 array of SRAM cells 100 shown in FIG. 31. The source-level S1 (see FIG. 2) may, as an example, be the level of the first active level L1 in which the source regions of the pull-down transistors PD1 and PD2 and pass-gate transistors PG1 and PG2 are formed. The source-level S1 of the first active level L1 may include a first n-well 1002, a second n-well 1004, a third n-well 1006, and a fourth n-well 1008. The source region 136 of the second pass-gate transistor PG2 of the SRAM cells 100-1 to 100-4 may respectively extend from the first n-well 1002, second n-well 1004, third n-well 1006, and fourth n-well 1008.

The array may also include various n-wells may extend across multiple cells 100. For example, the array may include a fifth n-well 1010 that extends along a Y-direction across the cells 100-1 and 100-2, and a sixth n-well 1012 that extends along a Y-direction across the cells 100-3 and 100-4. The source region 116 of the second pull-down transistor PD2 of each of the cells 100-1 and 100-2 may extend from the fifth n-well 1010, while the source region 116 of the second pull-down transistor PD2 of each of the cells 100-3 and 100-4 may extend from the sixth n-well 1012. In the embodiment shown in FIG. 32, the first n-well 1002, the second n-well 1004, and the fifth n-well 1010 may be aligned. Furthermore, in some embodiments, the third n-well 1006, the fourth n-well 1008, and the sixth n-well 1012 may be aligned, as shown in FIG. 32.

The array further includes a seventh n-well 1014 that extends along an X-direction across the cells 100-1 and 100-3, and an eighth n-well 1016 that extends along an X-direction across the cells 100-2 and 100-4. The seventh n-well 1014 may be located between the first n-well 1002 and the third n-well 1006, while the eighth n-well 1016 may be located between the second n-well 1004 and the fourth n-well 1008. The source region 102 of the first pull-down transistor PD2 of each of the cells 100-1 and 100-3 may extend from the seventh n-well 1014, while the source region 102 of the first pull-down transistor PD1 of each of the cells 100-2 and 100-4 may extend from the eighth n-well 1016.

The array further includes a ninth n-well 1018 that extends along an X-direction across the cells 100-1 and 100-3, and a tenth n-well 1020 that extends along an X-direction across the cells 100-2 and 100-4. The ninth n-well 1018 may be located between the fifth n-well 1010 and the sixth n-well 1012, while the tenth n-well 1020 may also be located between the fifth n-well 1010 and the sixth n-well 1012. The source region 130 of the first pass-gate transistor PG1 of each of the cells 100-1 and 100-3 may extend from the ninth n-well 1018, while the source region 130 of the first pass-gate transistor PG1 of each of the cells 100-2 and 100-4 may extend from the tenth n-well 1020.

Figure 33:
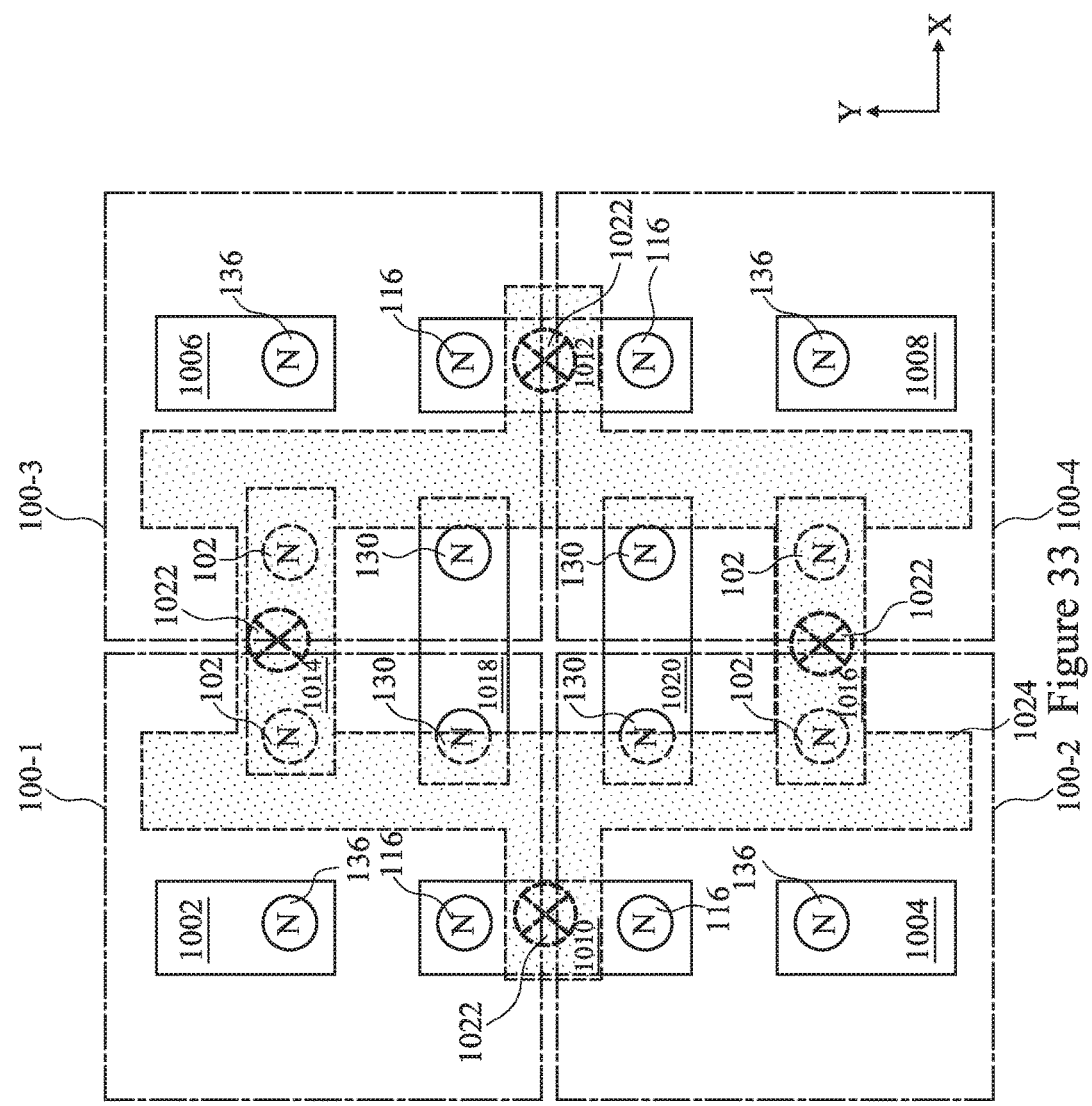

As described above in relation to FIG. 2, the source regions 116 and 102 of the pull-down transistors PD1, PD2 may be coupled to the second power voltage Vss. As shown in FIG. 33, this may be accomplished through the use of a plurality of power vias 1022 that may be respectively coupled to the fifth n-well 1010, the sixth n-well 1012, seventh n-well 1014, and eighth n-well 1016. The plurality of power vias 1022 may comprise a conductive material (e.g. similar to the conductive material of the first via 202 described above in respect of FIG. 2). The plurality of power vias 1022 may couple the fifth n-well 1010, the sixth n-well 1012, seventh n-well 1014, and eighth n-well 1016 to a second power rail 1024 that supplies the second power voltage Vss to the source regions 116 and 102 of the pull-down transistors PD1, PD2. The second power rail 1024 may comprise conductive material similar to the conductive material of the first via 202 described above in respect of FIG. 2 and may be formed in a metallization layer of the 2×2 array.

Figure 34:
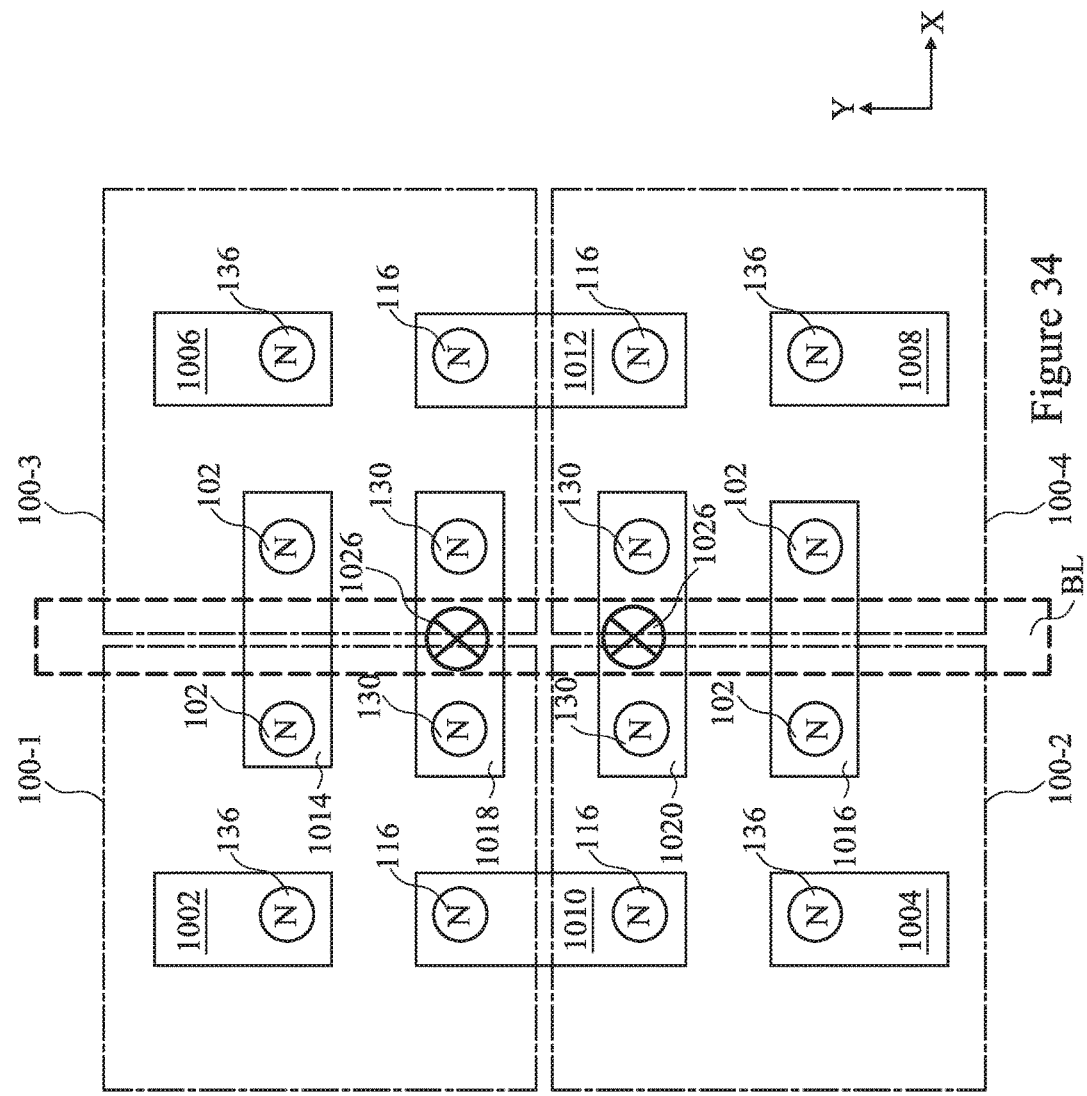

As described above in relation to FIG. 2, the source region 130 of the first pass-gate transistor PG1 may be electrically coupled to the bit line BL. As shown in FIG. 34, this may be accomplished through the use of a plurality of bit line vias 1026 that may be respectively coupled to the ninth n-well 1018 and the tenth n-well 1020. The plurality of bit line vias 1026 may comprise a conductive material (e.g. similar to the conductive material of the first via 202 described above in respect of FIG. 2). The bit line vias 1026 may couple the ninth n-well 1018 and the tenth n-well 1020 to the bit line BL that may be formed in a metallization layer of the 2×2 array. The bit line BL may be formed in a different metallization layer from the second power rail 1024.

Figure 35:
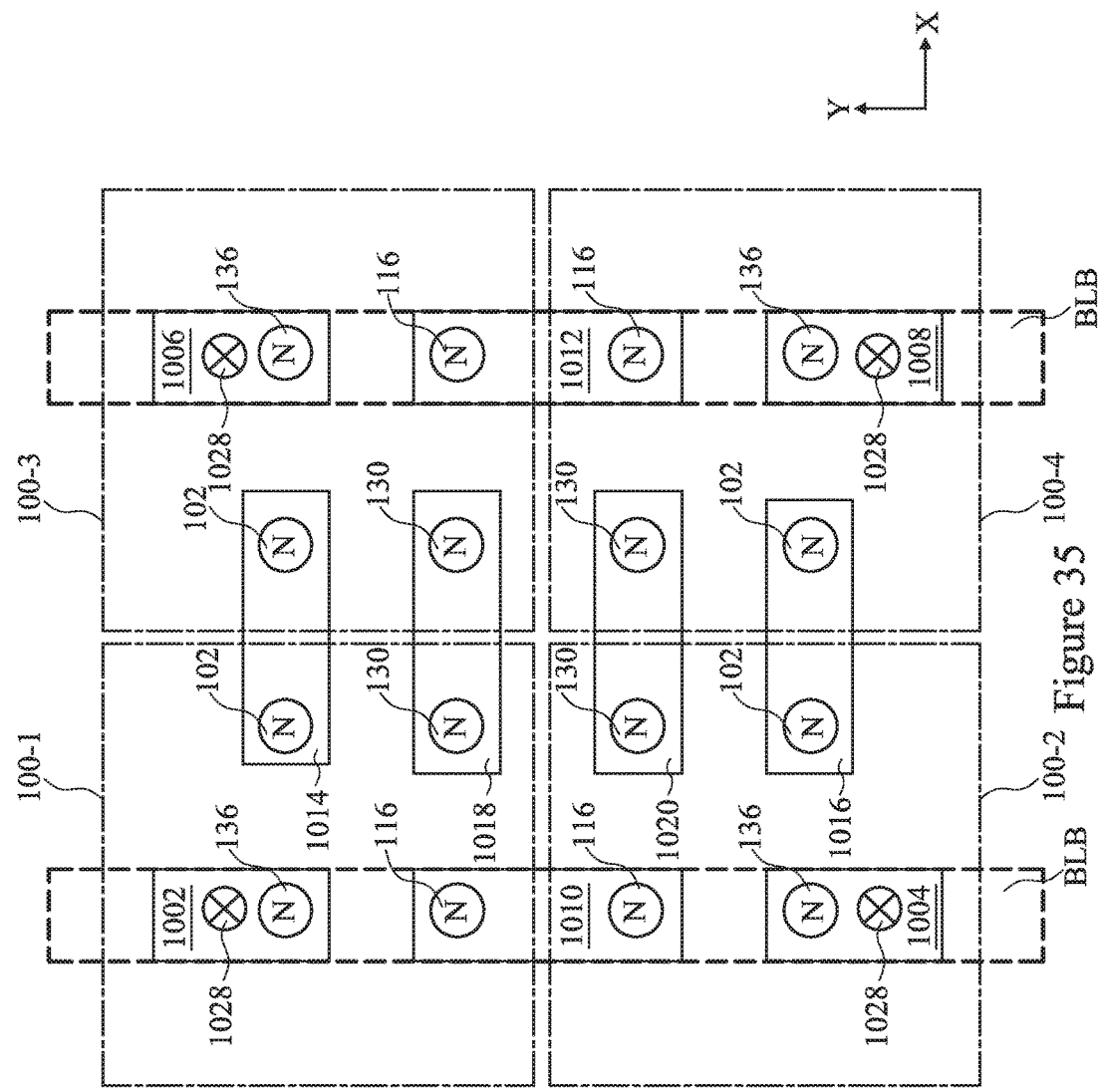

As described above in relation to FIG. 2, the source region 136 of the second pass-gate transistor PG2 may be electrically coupled to the complementary bit line BBL. As shown in FIG. 35, this may be accomplished through the use of a plurality of complementary bit line vias 1028 that may be respectively coupled to the first n-well 1002, the second n-well 1004, the third n-well 1006, and the fourth n-well 1008. The plurality of complementary bit line vias 1028 may comprise a conductive material (e.g. similar to the conductive material of the first via 202 described above in respect of FIG. 2). The complementary bit line vias 1028 may couple the first n-well 1002, the second n-well 1004, the third n-well 1006, and the fourth n-well 1008 to the complementary bit line BLB may be formed in a metallization layer of the 2×2 array. The complementary bit line BLB may be formed in the same metallization layer as the bit line BL.

Figure 36:
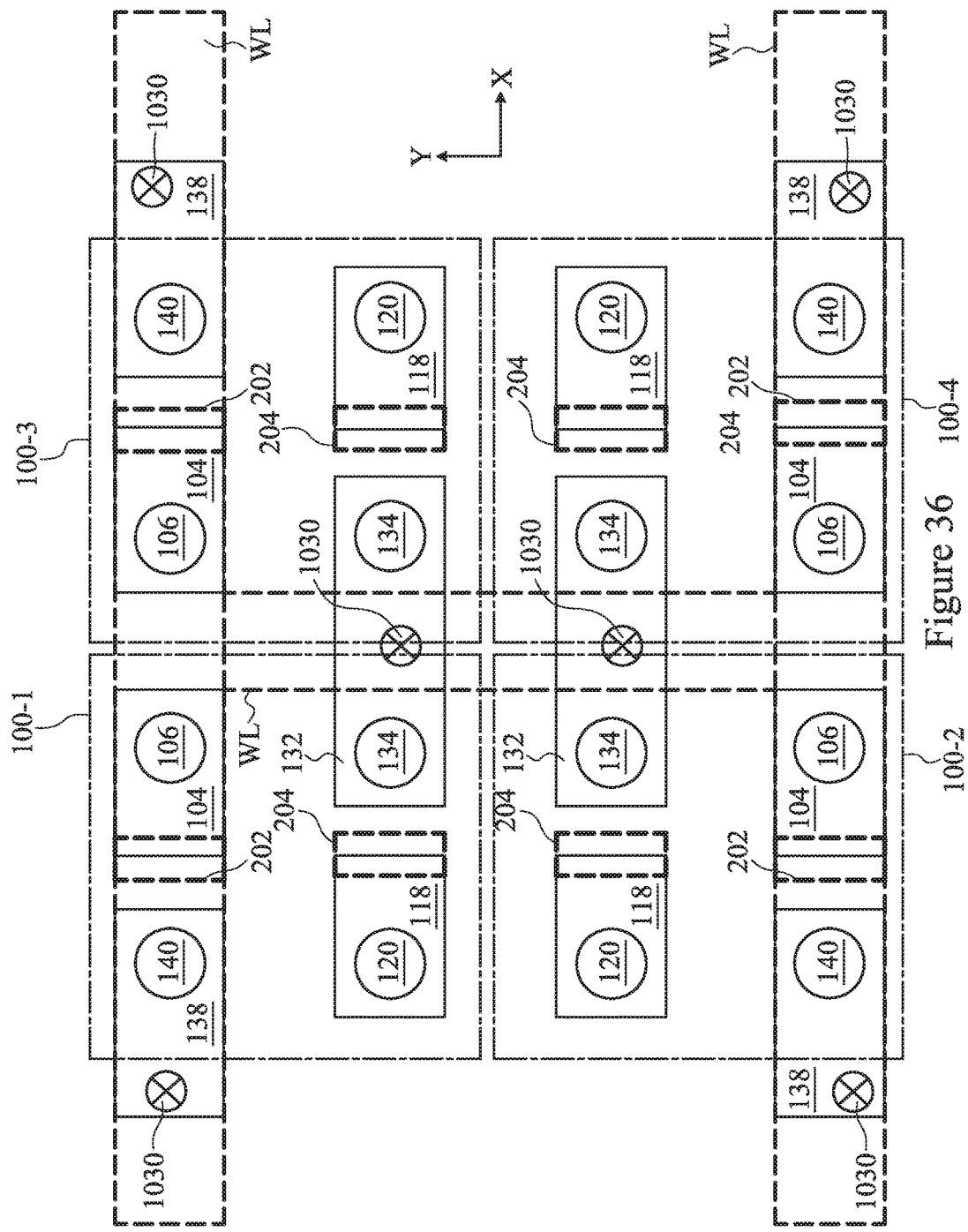
FIG. 36 shows an overlaid top-down view of a channel-level and a drain level of a first active level of the 2×2 array of SRAM cells shown in FIG. 31, in accordance with an embodiment.

In summary, FIGS. 32-35 show an overlaid top-down view of the source-level S1 of the first active level L1 of the 2×2 array of SRAM cells 100 shown in FIG. 31. FIG. 36 shows an overlaid top-down view of a channel-level C1 and a drain level D1 of the first active level L1 of the 2×2 array of SRAM cells 100 shown in FIG. 31. The channel-level C1 and the drain level D1 (see FIG. 2) may, as an example, be the level of the first active level L1 in which the channel regions and drain regions of the pull-down transistors PD1 and PD2 and pass-gate transistors PG1 and PG2 are formed.

As shown in FIG. 36, for each of the cells 100-1 to 100-4, the drain region 140 of the second pass-gate transistor PG2 may be formed over the channel region of the second pass-gate transistor PG2. In turn, the channel region of the second pass-gate transistor PG2 may be surrounded by the gate 138 of the second pass-gate transistor PG2. As shown in FIG. 36, for each of the cells 100-1 to 100-4, the drain region 106 of the first pull-down transistor PD1 may be formed over the channel region of the first pull-down transistor PD1. In turn, the channel region of the first pull-down transistor PD1 may be surrounded by the gate 104 of the first pull-down transistor PD1. As shown in FIG. 36, for each of the cells 100-1 to 100-4, the drain region 120 of the second pull-down transistor PD2 may be formed over the channel region of the second pull-down transistor PD2. In turn, the channel region of the second pull-down transistor PD2 may be surrounded by the gate 118 of the second pull-down transistor PD2. As shown in FIG. 36, for each of the cells 100-1 to 100-4, the drain region 134 of the first pass-gate transistor PG1 may be formed over the channel region of the first pass-gate transistor PG1. In turn, the channel region of the first pass-gate transistor PG1 may be surrounded by the gate 132 of the first pass-gate transistor PG1.

As described above in relation to FIG. 2, the gates of the pass-gate transistors PG1, PG2 may be electrically coupled to the write line WL. As shown in FIG. 36, this may be accomplished through the use of a plurality of word line vias 1030 that may be respectively coupled to the gates 138 and 132 of the pass-gate transistors PG1, PG2. The plurality of word line vias 1030 may comprise a conductive material (e.g. similar to the conductive material of the first via 202 described above in respect of FIG. 2). The word line vias 1030 may couple the gates 138 and 132 of the pass-gate transistors PG1, PG2 to the word line WL that may be formed in a metallization layer of the 2×2 array. As described above in relation to FIG. 2, the gates of the pull-down transistors PD1, PD2 may be coupled to the gates of the pull-up transistors PU1, PU2 through the use of the first via 202 and the second via 204. FIG. 36 also illustrates the first via 202 and the second via 204 of each of the cells 100-1 to 100-4.

FIG. 37 shows an overlaid top-down view of a trace level SL of the 2×2 array of SRAM cells 100 shown in FIG. 31, in accordance with an embodiment. The trace level SL (see FIG. 2) may, as an example, be the level in which the first conductive trace 114 and the second conductive trace 128 are formed. As shown in FIG. 37, the first conductive trace 114 may surround the drain region 106 of the first pull-down transistor PD1 and the drain region 134 of the first pass-gate transistor PG1, thereby coupling the drain region 106 of the first pull-down transistor PD1 and the drain region 134 of the first pass-gate transistor PG1 to each other. Also shown in FIG. 37, the second conductive trace 128 may surround the drain region 120 of the second pull-down transistor PD1 and the drain region 140 of the second pass-gate transistor PG2, thereby coupling the drain region 120 of the second pull-down transistor PD1 and the drain region 140 of the second pass-gate transistor PG2 to each other.

FIG. 38 shows an overlaid top-down view of a channel-level C2 and a drain level D2 of the second active level L2 of the 2×2 array of SRAM cells 100 shown in FIG. 31. The channel-level C2 and the drain level D2 (see FIG. 2) may, as an example, be the level of the second active level L2 in which the channel regions and drain regions of the pull-up transistors PU1, PU2 are formed. As shown in FIG. 38, for each of the cells 100-1 to 100-4, the channel region 1032 of the first pull-up transistor PU1 may be formed over the drain region 112 of the first pull-up transistor PU1. In turn, the channel region 1032 of the first pull-up transistor PU1 may be surrounded by the gate 110 of the first pull-up transistor PU1. As shown in FIG. 38, for each of the cells 100-1 to 100-4, the channel region 1034 of the second pull-up transistor PU2 may be formed over the drain region 126 of the second pull-up transistor PU2. In turn, the channel region 1034 of the second pull-up transistor PU2 may be surrounded by the gate 124 of the second pull-up transistor PU2. As described above in relation to FIG. 2, the gates of transistors PU2 and PD2 may be coupled to the drains of transistors PU1 and PD1 through the use of the fourth via 208, while the gates of transistors PU1 and PD1 may be coupled to the drains of transistors PU2 and PD2 through the use of the third via 206. The third via 206 and the fourth via 208 are also illustrated in FIG. 38 for each of the cells 100-1 to 100-4. As described above in relation to FIG. 2, the gates of the pull-down transistors PD1, PD2 may be coupled to the gates of the pull-up transistors PU1, PU2 through the use of the first via 202 and the second via 204. FIG. 38 also illustrates the first via 202 and the second via 204 of each of the cells 100-1 to 100-4.

FIG. 39 shows an overlaid top-down view of a source-level S2 of the second active level L2 of the 2×2 array of SRAM cells 100 shown in FIG. 31, in accordance with an embodiment. The source-level S2 (see FIG. 2) may, as an example, be the level of the second active level L2 in which the source regions of the pull-up transistors PU1 and PU2 are formed. As shown in FIG. 39, each of the cells 100-1 to 100-4 includes the source region 108 of the first pull-up transistor PU1 and the source region 122 of the second pull-up transistor PU2. As described above in respect of FIG. 2, sources 108 and 122 of the pull-up transistors PU1 and PU2 are coupled to the first power voltage Vdd. As shown in FIG. 39, this may be accomplished by forming a first power rail 1036 around the sources 108 and 122 of each of the cells 100-1 to 100-4. The first power rail 1036 may comprise conductive material similar to the conductive material of the first via 202 and may be electrically coupled to the first power voltage Vdd. FIG. 40 shows another embodiment where the amount of conductive material used to form the first power rail 1036 is reduced.

The architecture described above in respect of FIGS. 31 to 40 can decrease the footprint of the SRAM cell 100 and, consequently, increase the integration density of a plurality of such SRAM cells 100 (such as the 2×2 array shown in FIG. 31). For example, the first via 202, second via 204, third via 206, and fourth via 208 allow for the vertical interconnection of the pull-up transistors PU1 and PU2, pull-down transistors PD1 and PD2, and pass-gate transistors PG1 and PG2, thus reducing the footprint of the SRAM cell 100.

According to various embodiments presented herein, a method includes forming a first vertical transistor including a first source region surrounded by a first dielectric layer, a first channel region above the first source region, a first drain region above the first channel region and surrounded by a second dielectric layer, and a first gate electrode layer around the first channel region. The first gate electrode layer is disposed between the first dielectric layer and the second dielectric layer. The method also includes forming a second vertical transistor including a second source region surrounded by the first dielectric layer, a second channel region above the second source region, a second drain region above the second channel region and surrounded by the second dielectric layer, and a second gate electrode layer around the second channel region. The second gate electrode layer is different from the first gate electrode layer and is disposed between the first dielectric layer and the second dielectric layer. The method also includes forming a third vertical transistor above the first vertical transistor and forming a via above the second vertical transistor, wherein a portion of the via is surrounded by a gate electrode of a fourth vertical transistor According to various embodiments presented herein, a method includes forming a first epitaxial layer on a semiconductor substrate, removing portions of the first epitaxial layer to leave a plurality of first vertical epitaxial structures protruding from the semiconductor substrate, and forming a first dielectric layer over the semiconductor substrate. The method also includes forming a first gate layer over the first dielectric layer, the first gate layer including a first gate dielectric layer adjacent to and contacting the sidewalls of each first vertical epitaxial structure of the plurality of first vertical epitaxial structures and a first gate electrode layer adjacent to and contacting the first gate dielectric layer. The method also includes forming a second dielectric layer over the first gate layer, forming a first conductive layer over the second dielectric layer, forming a third dielectric layer over the first conductive layer, forming a second gate electrode layer over the third dielectric layer, forming a fourth dielectric layer over the second gate electrode layer, and forming openings in the third dielectric layer, the second gate electrode layer, and the fourth dielectric layer, wherein the openings are over each first vertical epitaxial structure of the plurality of first vertical epitaxial structures. The method also includes forming a second gate dielectric layer on the sidewalls of a first set of the openings, forming second vertical epitaxial structures within each opening of the first set of the openings, and forming a metal feature in each opening of a second set of the openings.

According to various embodiments presented herein, a method of forming an SRAM cell includes forming a first vertical pull-down transistor, a second vertical pull-down transistor, a first vertical pass-gate transistor, and a second vertical pass-gate transistor over a semiconductor substrate. The method also includes forming a first conductive trace over a top surface of the first vertical pull-down transistor and the first vertical pass-gate transistor, forming a second conductive trace over a top surface of the second vertical pull-down transistor and the second vertical pass-gate transistor, forming a first vertical pull-up transistor over a first portion of the first conductive trace, wherein the first vertical pull-up transistor is substantially aligned over the first vertical pull-down transistor. The method also includes forming a second vertical pull-up transistor over a first portion of the second conductive trace, wherein the second vertical pull-up transistor is substantially aligned over the second vertical pull-down transistor. The method also includes forming a first via over a second portion of the first conductive trace, wherein a portion of the first via is surrounded by a gate electrode of the first vertical pull-up transistor, and forming a second via over a second portion of the second conductive trace, wherein a portion of the second via is surrounded by a gate electrode of the second vertical pull-up transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first vertical transistor comprising a first gate electrode;
    a second vertical transistor disposed above the first vertical transistor and comprising a second gate electrode different from the first gate electrode;
    a third vertical transistor comprising a third gate electrode different from the first gate electrode and the second gate electrode, wherein the third vertical transistor is disposed adjacent the first vertical transistor;
    a fourth vertical transistor comprising a fourth gate electrode, wherein the fourth gate electrode is different from the first gate electrode and the second gate electrode and the third gate electrode;
    a first conductive layer contacting a drain region of the first vertical transistor and a drain region of the third vertical transistor; and
    a first via above the third vertical transistor and contacting the first conductive layer, wherein a portion of the first via is surrounded by the fourth gate electrode.

2. The semiconductor device of claim 1, wherein the first vertical transistor is an n-channel transistor, and wherein the second vertical transistor is a p-channel transistor.

3. The semiconductor device of claim 1, wherein the second vertical transistor comprises a polysilicon material.

4. The semiconductor device of claim 1, wherein the second vertical transistor is a junctionless transistor.

5. The semiconductor device of claim 1, wherein the first conductive layer comprises silicide.

6. The semiconductor device of claim 1, further comprising a second via above and contacting a fifth vertical transistor, wherein a portion of the second via is surrounded by the second gate electrode.

7. The semiconductor device of claim 6, further comprising a second conductive layer contacting the second via and a drain region of the fourth vertical transistor.

8. The semiconductor device of claim 1, further comprising a third via extending between and contacting the first gate electrode and the second gate electrode.

9. A device, comprising:
    a first vertical transistor comprising a first gate electrode layer;
    a second vertical transistor adjacent the first vertical transistor and comprising a second gate electrode layer, the second gate electrode layer different from the first gate electrode layer;
    a conductive layer extending over and contacting the second vertical transistor and the first vertical transistor;
    a first via aligned above the second vertical transistor and contacting the conductive layer; and
    a third vertical transistor comprising a third gate electrode layer, wherein the third gate electrode layer is different from the first gate electrode layer and the second gate electrode layer, and wherein the third gate electrode layer contacts the first via.

10. The device of claim 9, wherein the first via is encircled by the third gate electrode layer.

11. The device of claim 9, wherein a top surface of the first via extends above a top surface of the third gate electrode.

12. The device of claim 9, wherein the first gate electrode layer surrounds a channel region of the first vertical transistor.

13. The device of claim 9, further comprising a fourth vertical transistor aligned above the first vertical transistor and contacting the conductive layer, the fourth vertical transistor comprising a fourth gate electrode layer.

14. The device of claim 9, further comprising a second via contacting the first gate electrode layer and the fourth gate electrode layer.

15. The device of claim 9, wherein the channel of the first vertical transistor has a substantially circular cross-section.

16. A semiconductor device, comprising:
  a first vertical pull-down transistor comprising a first gate electrode, the first gate electrode extending laterally in a first active level of the semiconductor device;
  a first vertical pull-up transistor stacked over the first vertical pull-down transistor and comprising a second gate electrode, the second gate electrode extending laterally in a second active level of the semiconductor device;
  a first vertical pass-gate transistor in the first active level of the semiconductor device;
  a first conductive trace disposed between a drain region of the first vertical pull-down transistor and a drain region of the first vertical pull-up transistor, a first portion of the first conductive trace extending over a drain region of the first vertical pass-gate transistor and contacting the drain region of the first vertical pass-gate transistor;
  a first via over and contacting the first portion of the first conductive trace; and
  a second vertical pull-up transistor comprising a third gate electrode extending laterally in the second active level of the semiconductor device and contacting the first via.

17. The semiconductor device of claim 16, further comprising a second via extending vertically from the first gate electrode to the second gate electrode.

18. The semiconductor device of claim 16, wherein the first vertical pull-up transistor comprises a polycrystalline semiconductor material.

19. The semiconductor device of claim 16, wherein the first vertical pull-up transistor is laterally aligned with the first vertical pull-down transistor.

20. The semiconductor device of claim 16, wherein the third gate electrode laterally surrounds a portion of the first via.

* * * * *